United States Patent
Ito

(10) Patent No.: US 10,804,438 B2
(45) Date of Patent: Oct. 13, 2020

(54) SEMICONDUCTOR LIGHT-EMITTING DEVICE

(71) Applicant: ROHM CO., LTD., Kyoto-shi, Kyoto (JP)

(72) Inventor: Yohei Ito, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 16/160,555

(22) Filed: Oct. 15, 2018

(65) Prior Publication Data

US 2019/0115502 A1  Apr. 18, 2019

(30) Foreign Application Priority Data

Oct. 18, 2017 (JP) .................................. 2017-202116
Aug. 29, 2018 (JP) .................................. 2018-160697

(51) Int. Cl.
| H01L 33/46 | (2010.01) |
| H01L 33/62 | (2010.01) |
| H01L 33/42 | (2010.01) |
| H01L 33/38 | (2010.01) |
| H01L 33/24 | (2010.01) |
| H01L 33/22 | (2010.01) |
| H01L 33/40 | (2010.01) |
| H01L 33/06 | (2010.01) |

(52) U.S. Cl.
CPC .............. *H01L 33/46* (2013.01); *H01L 33/22* (2013.01); *H01L 33/24* (2013.01); *H01L 33/38* (2013.01); *H01L 33/405* (2013.01); *H01L 33/42* (2013.01); *H01L 33/62* (2013.01); *H01L 33/06* (2013.01); *H01L 2933/0016* (2013.01); *H01L 2933/0025* (2013.01); *H01L 2933/0066* (2013.01)

(58) Field of Classification Search
CPC ......... H01L 33/46; H01L 33/22; H01L 33/24; H01L 33/38; H01L 33/405; H01L 33/42; H01L 33/62; H01L 33/06
See application file for complete search history.

(56) References Cited

U.S. PATENT DOCUMENTS

| 2007/0215878 A1* | 9/2007 | Wuu ....................... H01L 33/08 257/72 |
| 2010/0065870 A1* | 3/2010 | Arai ...................... H01L 33/405 257/98 |
| 2014/0077221 A1* | 3/2014 | Genei ................. H01L 33/0025 257/76 |

(Continued)

FOREIGN PATENT DOCUMENTS

JP   2005175462 A   6/2005

*Primary Examiner* — Joseph M Galvin, III
(74) *Attorney, Agent, or Firm* — Hamre, Schumann, Mueller & Larson, P.C.

(57) ABSTRACT

A semiconductor light-emitting device includes a semiconductor layer, having a major surface and generating light, a light transmitting layer, having a light transmitting property and covering the major surface of the semiconductor layer, a light reflecting layer, having a light reflecting property and covering the light transmitting layer, and a bonding material diffusion region, formed in a surface layer portion of the light reflecting layer in a boundary portion between the light transmitting layer and the light reflecting layer and having an element having a property of being high in adhesion force with respect to the light transmitting layer more so than an element constituting the light reflecting layer.

29 Claims, 26 Drawing Sheets

(56) References Cited

U.S. PATENT DOCUMENTS

| | | | | |
|---|---|---|---|---|
| 2015/0249180 A1* | 9/2015 | Akaike | ................ | H01L 33/005 438/29 |
| 2015/0255680 A1* | 9/2015 | Matsumura | ........... | H01L 33/387 257/94 |
| 2015/0295135 A1* | 10/2015 | Park | ........................ | H01L 33/38 257/98 |

* cited by examiner

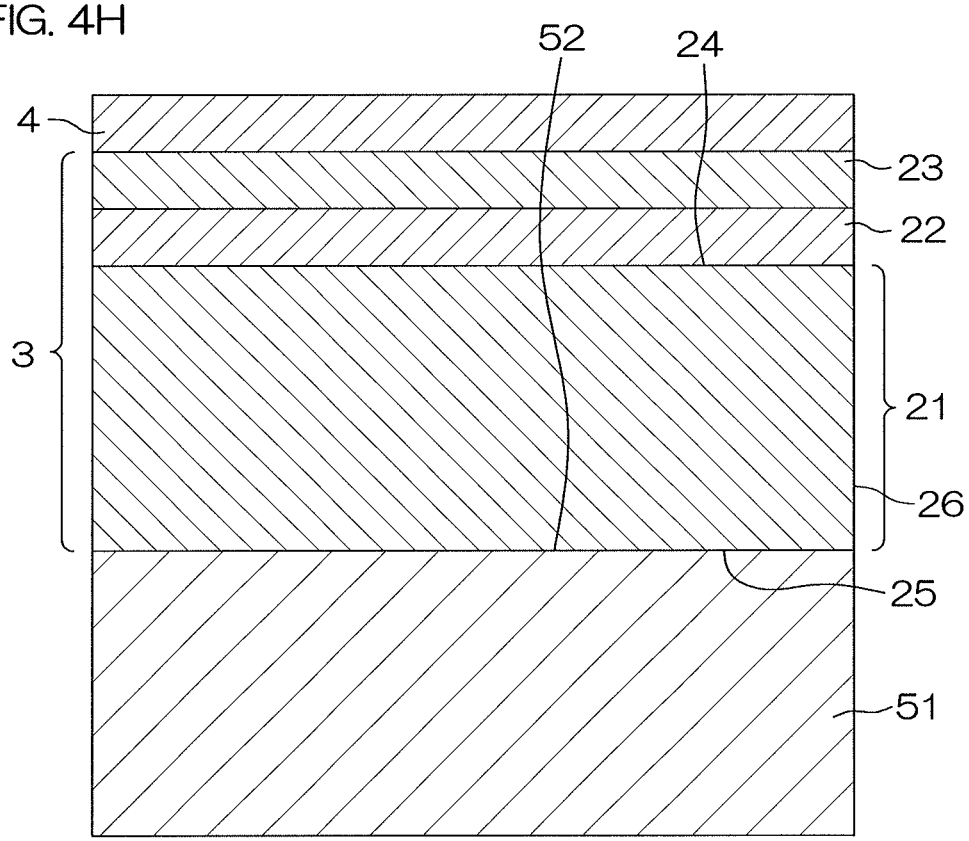

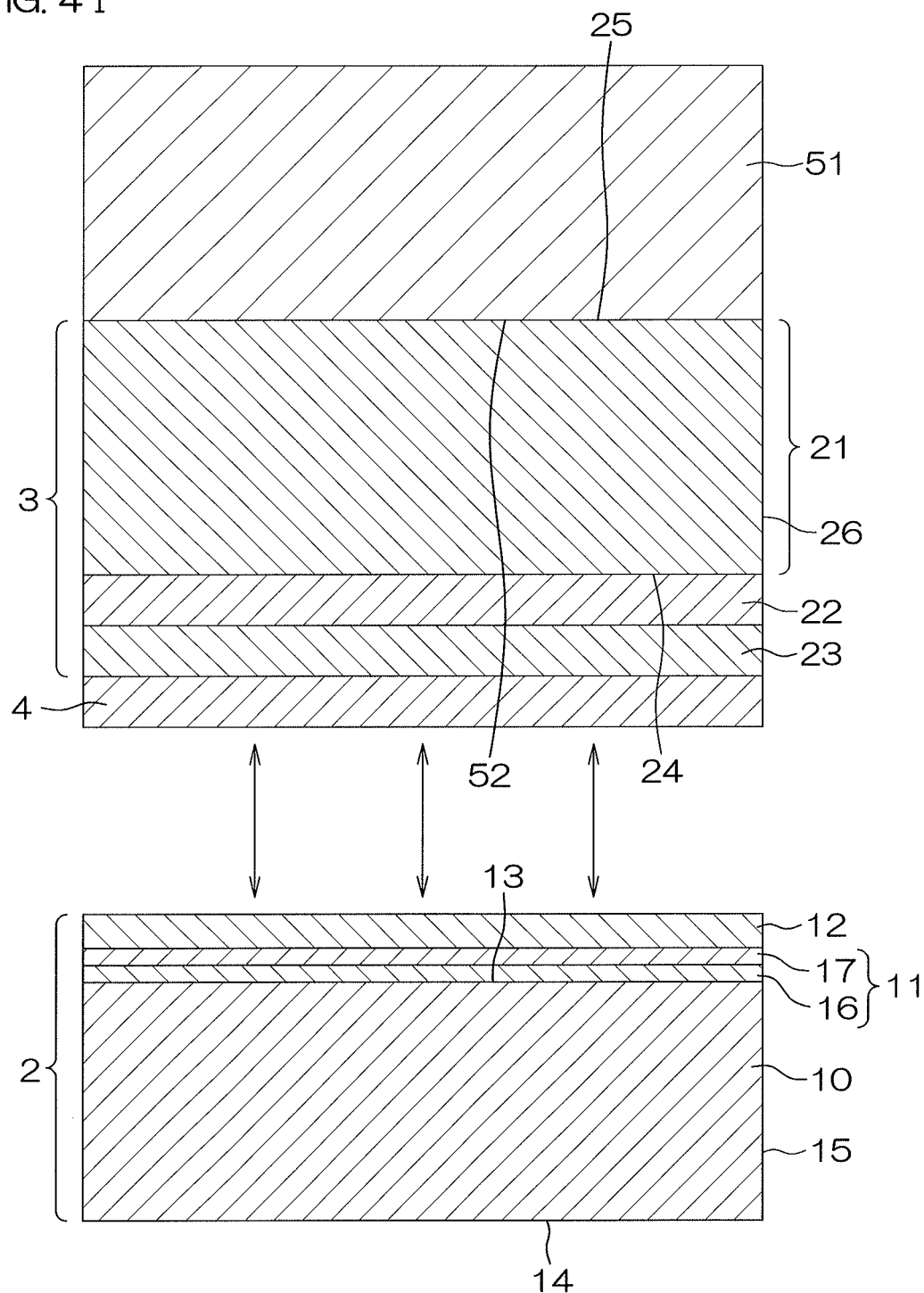

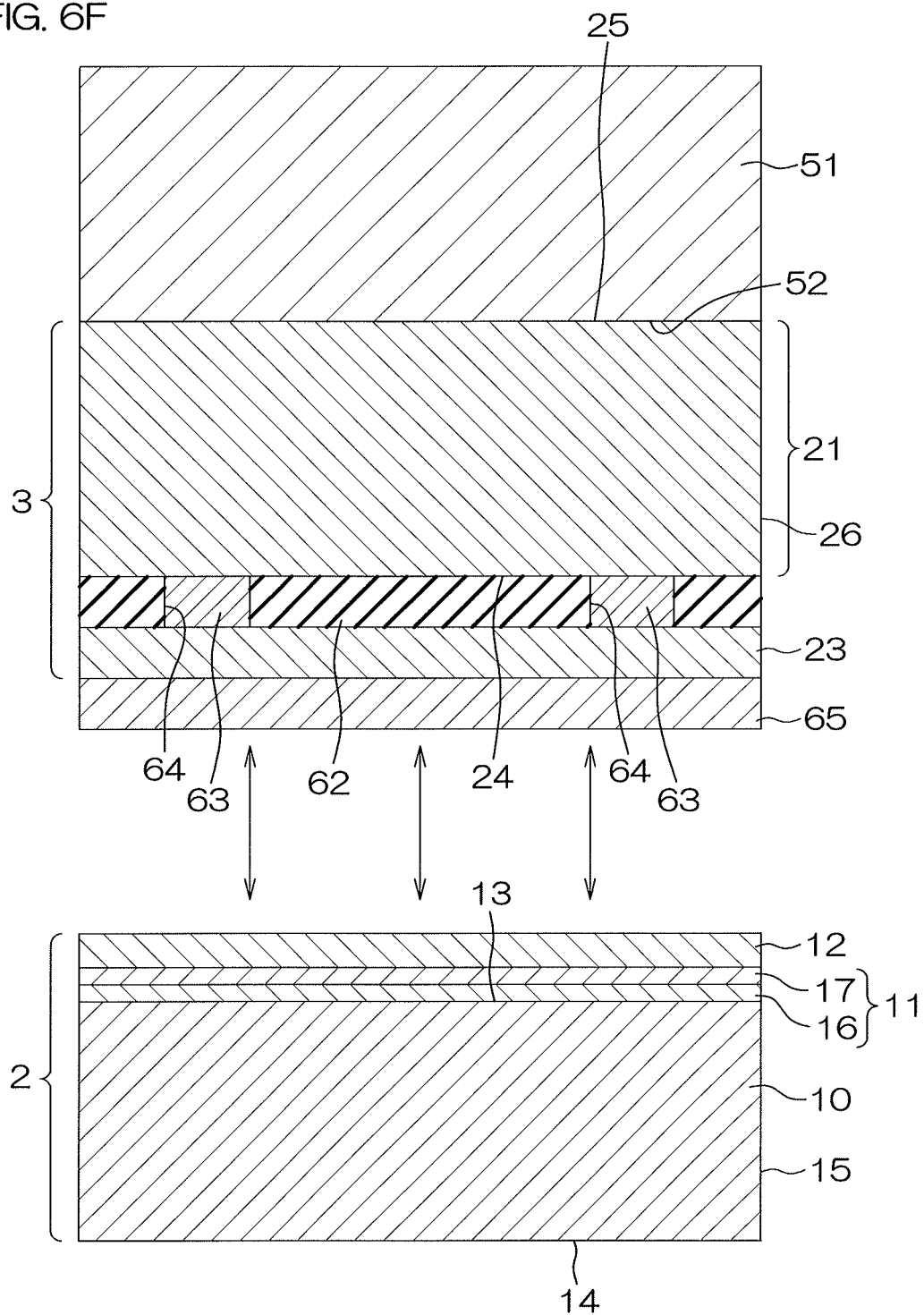

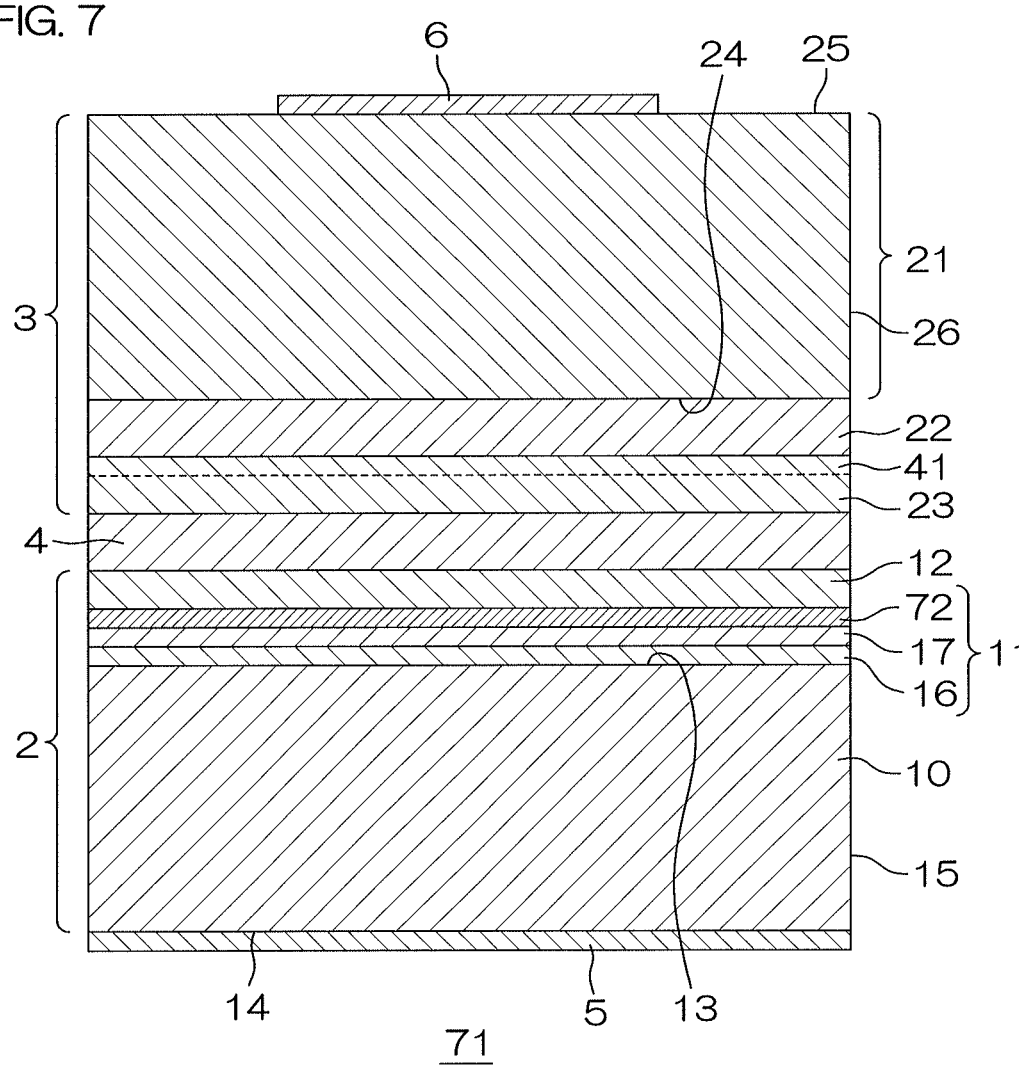

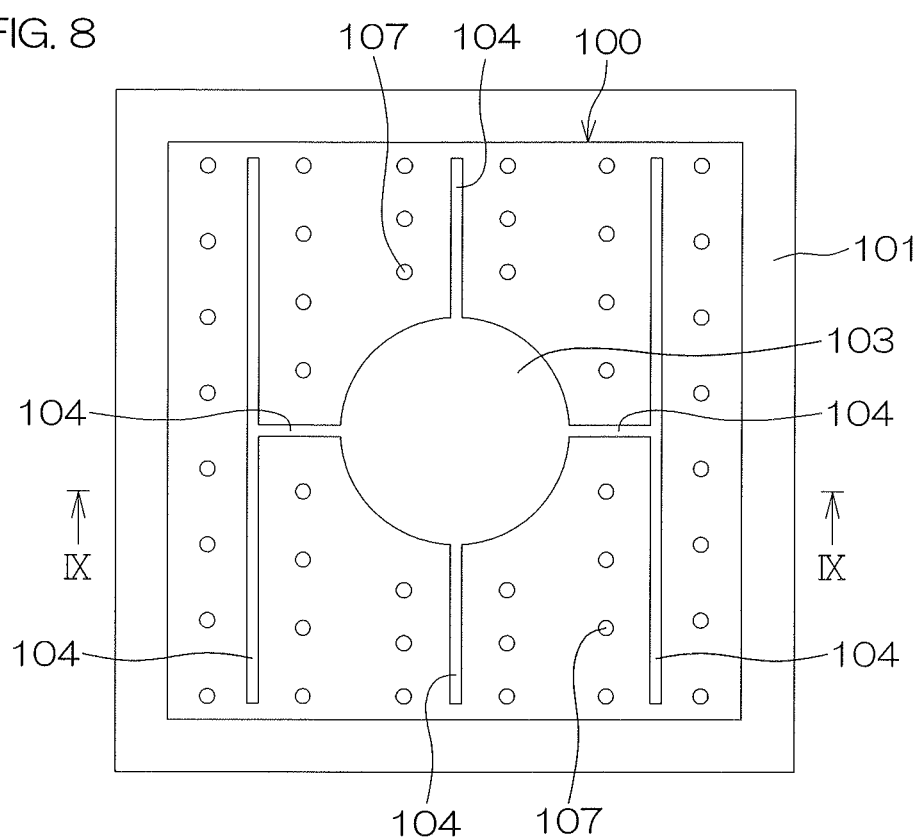

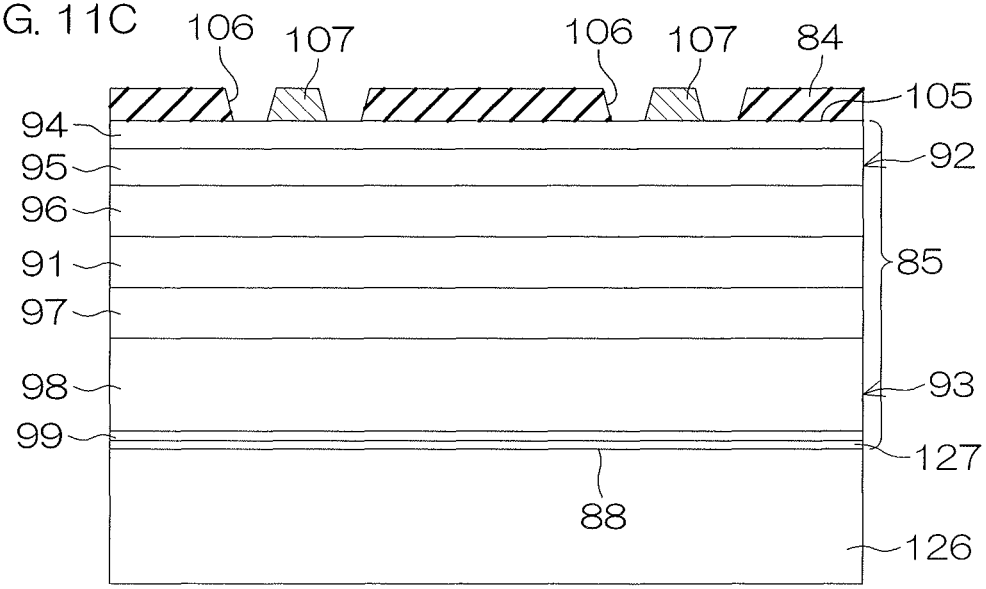
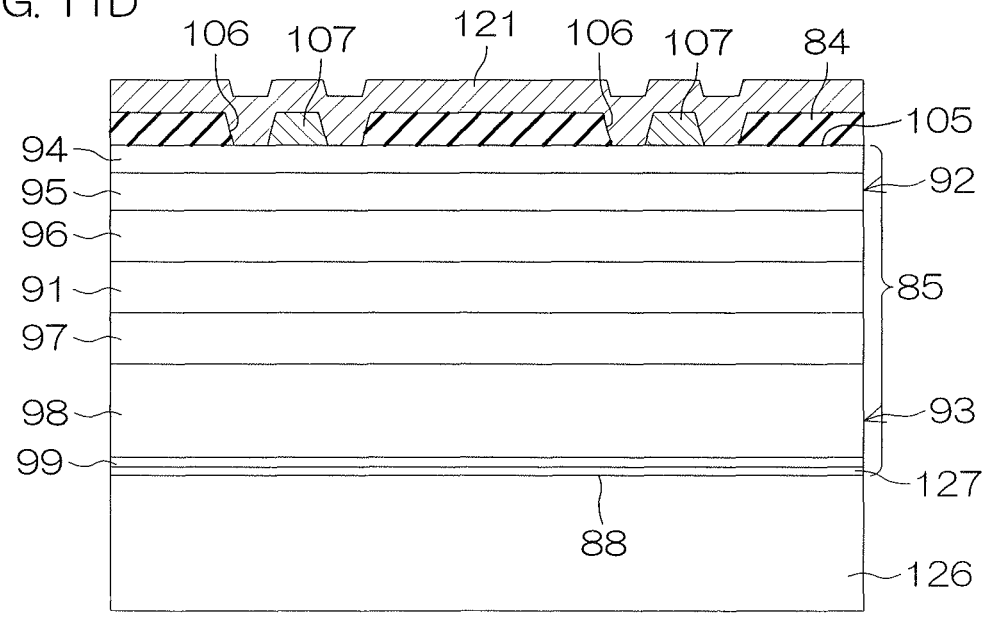

FIG. 11E
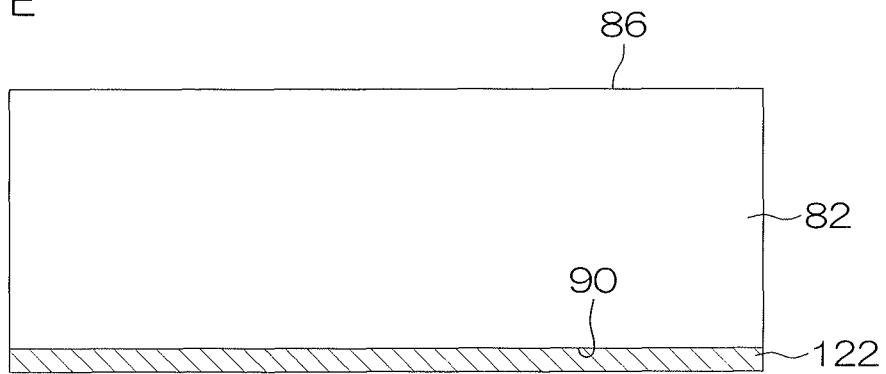
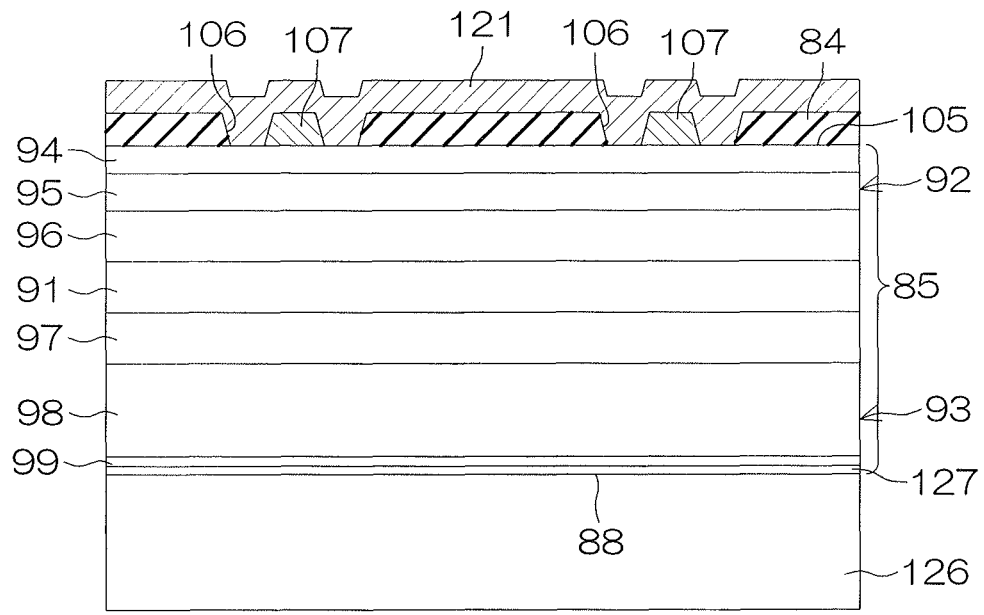

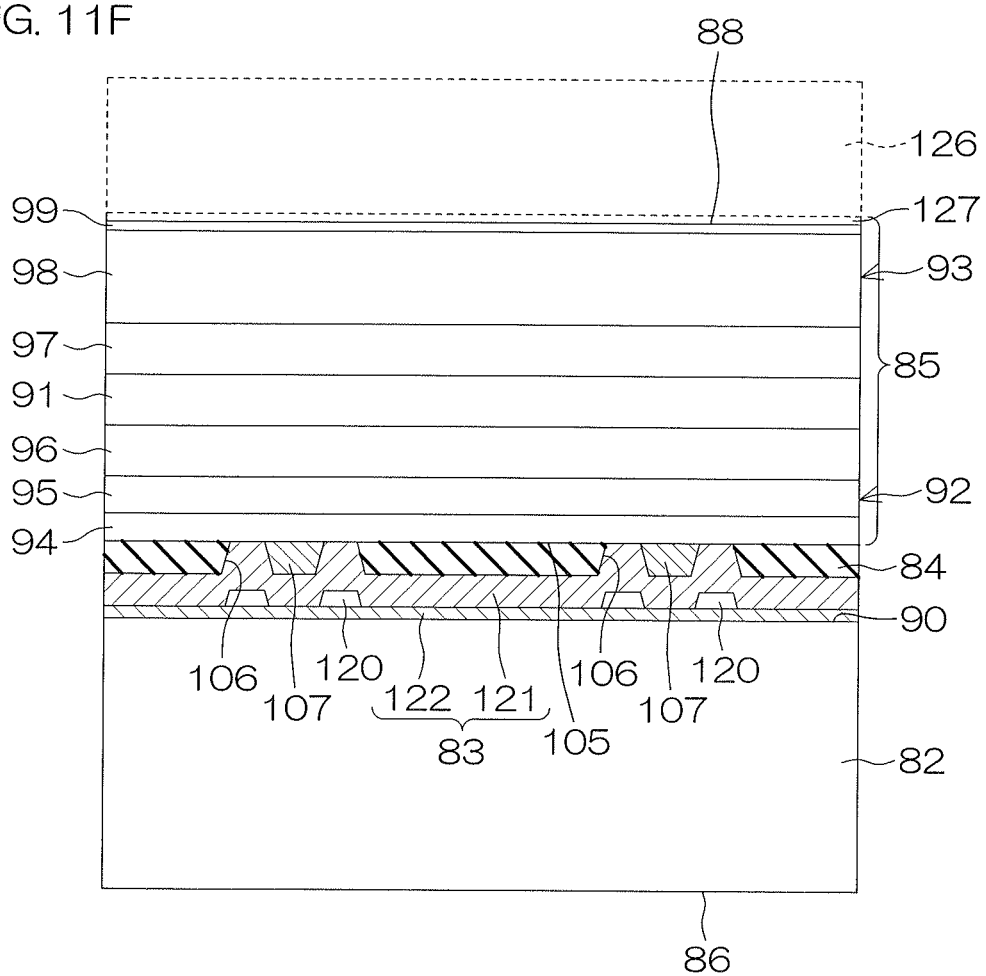

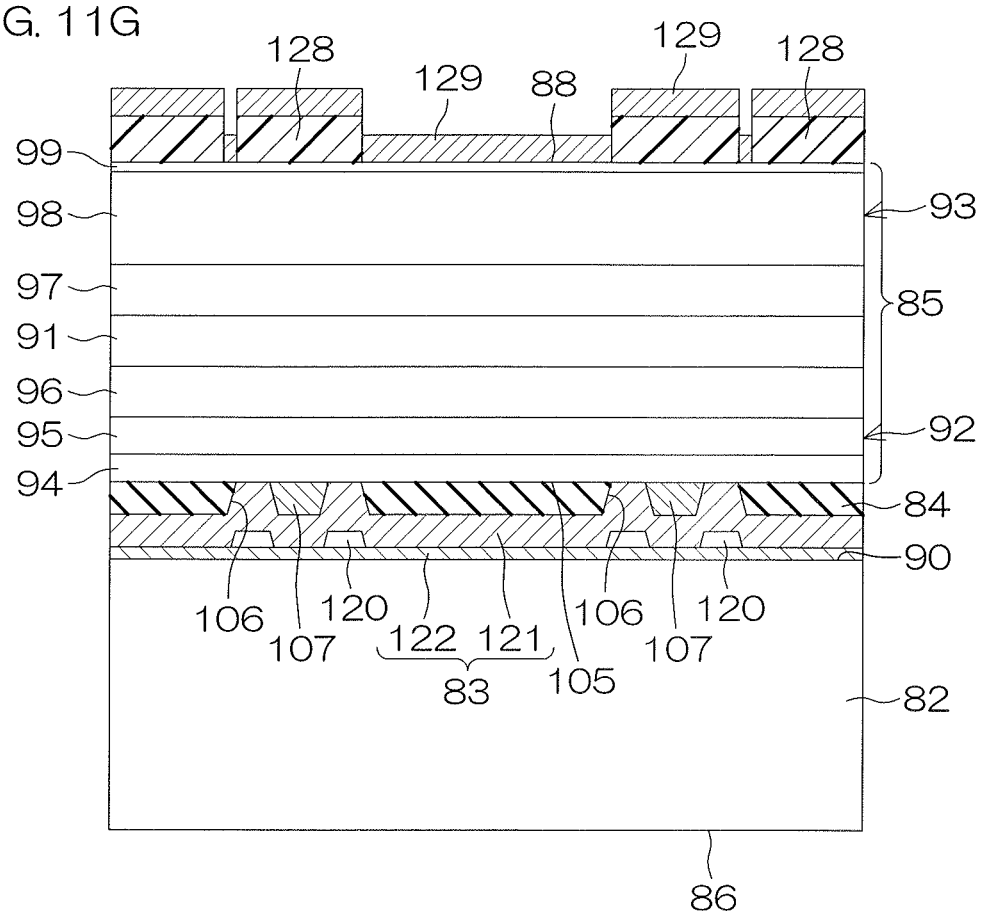

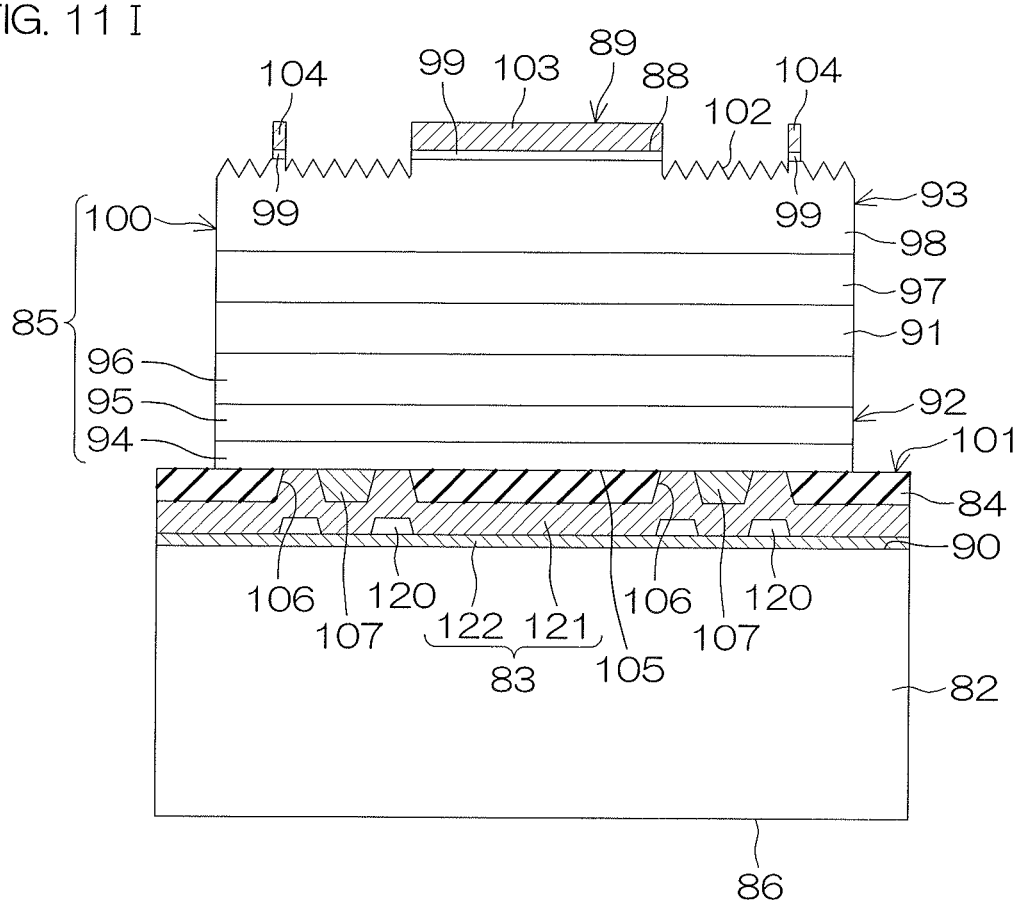

SEMICONDUCTOR LIGHT-EMITTING DEVICE

CROSS-REFERENCE TO RELATED APPLICATIONS

The present application corresponds to Japanese Patent Application No. 2017-202116 filed on Oct. 18, 2017 in the Japan Patent Office and Japanese Patent Application No. 2018-160697 filed on Aug. 29, 2018 in the Japan Patent Office, and the entire disclosures of these applications are incorporated herein by reference.

TECHNICAL FIELD

The present invention relates to a semiconductor light-emitting device.

BACKGROUND ART

A semiconductor light-emitting element is disclosed in Patent Document 1 (Japanese Patent Application Publication No. 2005-175462). The semiconductor light-emitting element has a structure, in which a non-light-emitting portion and a light-emitting portion are bonded by a first bonding metal layer and a second bonding metal layer.

The non-light-emitting portion includes a silicon substrate and the second bonding metal layer, covering the silicon substrate. The light-emitting portion includes a semiconductor region, which generates light, a light transmitting layer, covering a major surface of the semiconductor region, a light reflecting layer, covering the light transmitting layer, and the first bonding metal layer, covering the light reflecting layer.

The light-emitting portion is disposed on the non-light-emitting portion such that the major surface of the semiconductor region faces the major surface of the silicon substrate of the non-light-emitting portion. In this state, the first bonding metal layer of the light-emitting portion is bonded to the second bonding metal layer of the non-light-emitting portion.

SUMMARY OF INVENTION

With a structure such as that of the semiconductor light-emitting element according to Patent Document 1 where a light transmitting layer is covered by a light reflecting layer, compatibility of the light reflecting layer with respect to the light transmitting layer becomes a topic of discussion at times.

For example, if the compatibility of the light reflecting layer with respect to the light transmitting layer is low, there is a possibility that an adhesion force of the light reflecting layer with respect to the light transmitting layer becomes insufficient and light reflectance due to the light reflecting layer is decreased.

An object of a preferred embodiment of the present invention is thus to provide a semiconductor light-emitting device with which an adhesion force of a light reflecting layer with respect to a light transmitting layer can be improved.

A preferred embodiment of the present invention provides a semiconductor light-emitting device including a semiconductor layer, having a major surface and generating light, a light transmitting layer, having a light transmitting property and covering the major surface of the semiconductor layer, a light reflecting layer, having a light reflecting property and covering the light transmitting layer, and a bonding material diffusion region, formed in a surface layer portion of the light reflecting layer in a boundary portion between the light transmitting layer and the light reflecting layer and having an element having a property of being high in adhesion force with respect to the light transmitting layer more so than an element constituting the light reflecting layer.

With the present semiconductor light-emitting device, the bonding material diffusion region is formed in the surface layer portion of the light reflecting layer in the boundary portion between the light transmitting layer and the light reflecting layer. The bonding material diffusion region contains the element having the property of being high in adhesion force with respect to the light transmitting layer more so than the element constituting the light reflecting layer. An adhesion force of the light reflecting layer with respect to the light transmitting layer can thereby be improved.

A preferred embodiment of the present invention provides a semiconductor light-emitting device including a non-light-emitting body portion, including a substrate, having a first front surface at one side and a first rear surface at another side, and a first light reflecting layer, having a light reflecting property and covering the first front surface of the substrate, and a light-emitting body portion, including a semiconductor layer, having a second front surface at one side and a second rear surface at another side and generating light, a light transmitting layer, having a light transmitting property and covering the second front surface of the semiconductor layer, a second light reflecting layer, having a light reflecting property and covering the light transmitting layer, and a bonding material diffusion region, formed in a surface layer portion of the second light reflecting layer in a boundary portion between the light transmitting layer and the second light reflecting layer and having an element having a property of being high in adhesion force with respect to the light transmitting layer more so than an element constituting the second light reflecting layer, and being disposed on the non-light-emitting body portion in an orientation where the second front surface of the semiconductor layer faces the first front surface of the substrate of the non-light-emitting body portion.

With the present semiconductor light-emitting device, the bonding material diffusion region is formed in the surface layer portion of the second light reflecting layer in the boundary portion between the light transmitting layer and the second light reflecting layer. The bonding material diffusion region contains the element having the property of being high in adhesion force with respect to the light transmitting layer more so than the element constituting the second light reflecting layer. An adhesion force of the second light reflecting layer with respect to the light transmitting layer can thereby be improved.

BRIEF DESCRIPTION OF DRAWINGS

FIG. 4H is a sectional view of a step described subsequently to FIG. 4G.

FIG. 4I is a sectional view of a step described subsequently to FIG. 4H.

FIG. 6F is a sectional view of a step described subsequently to FIG. 6E.

FIG. 7 is a sectional view of a semiconductor light-emitting device according to a third preferred embodiment of the present invention.

FIG. 8 is a plan view of a semiconductor light-emitting device according to a fourth preferred embodiment of the present invention.

FIG. 11C is a sectional view of a step described subsequently to FIG. 11B.

FIG. 11D is a sectional view of a step described subsequently to FIG. 11C.

FIG. 11E is a sectional view of a step described subsequently to FIG. 11D.

FIG. 11F is a sectional view of a step described subsequently to FIG. 11E.

FIG. 11G is a sectional view of a step described subsequently to FIG. 11F.

FIG. 11I is a sectional view of a step described subsequently to FIG. 11H.

DESCRIPTION OF EMBODIMENTS

Preferred embodiments of the present invention shall now be described in detail with reference to the attached drawings.

Figure 1:
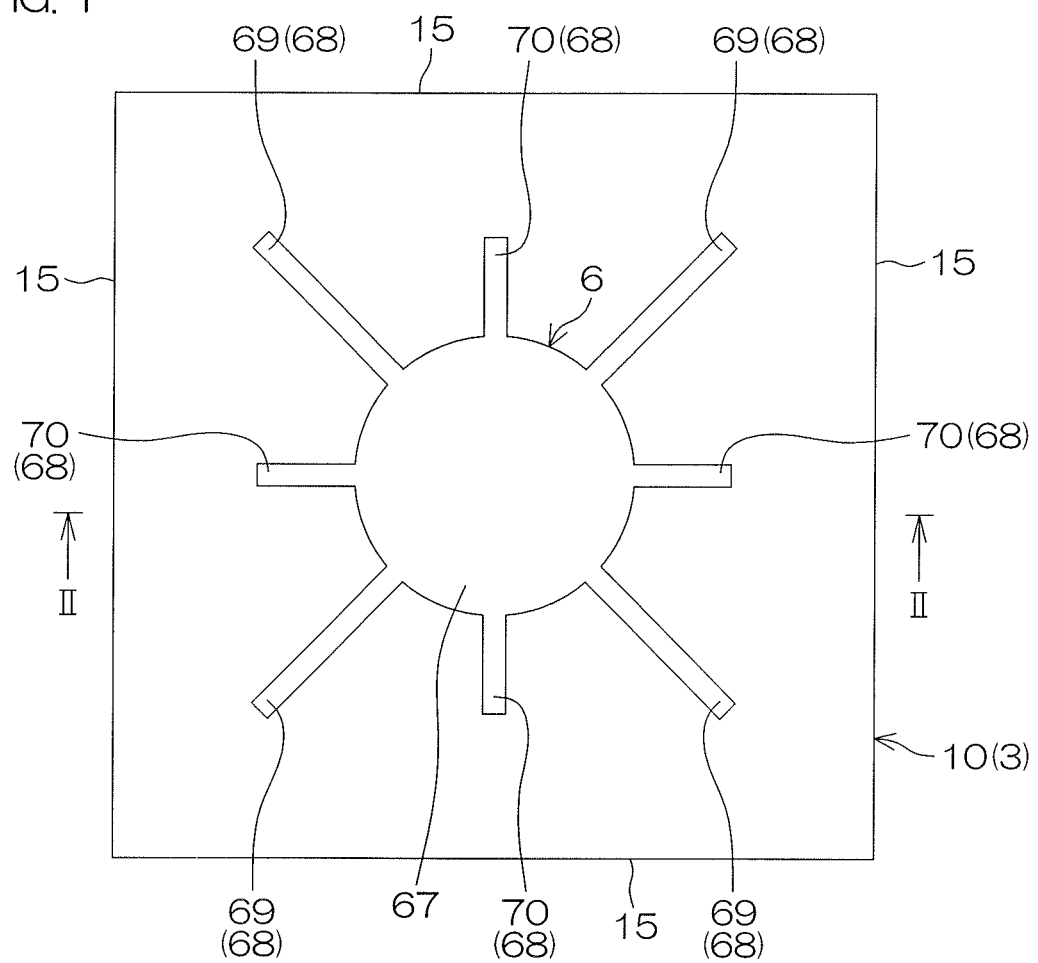
FIG. 1 is a plan view of a semiconductor light-emitting device according to a first preferred embodiment of the present invention.
Figure 2:
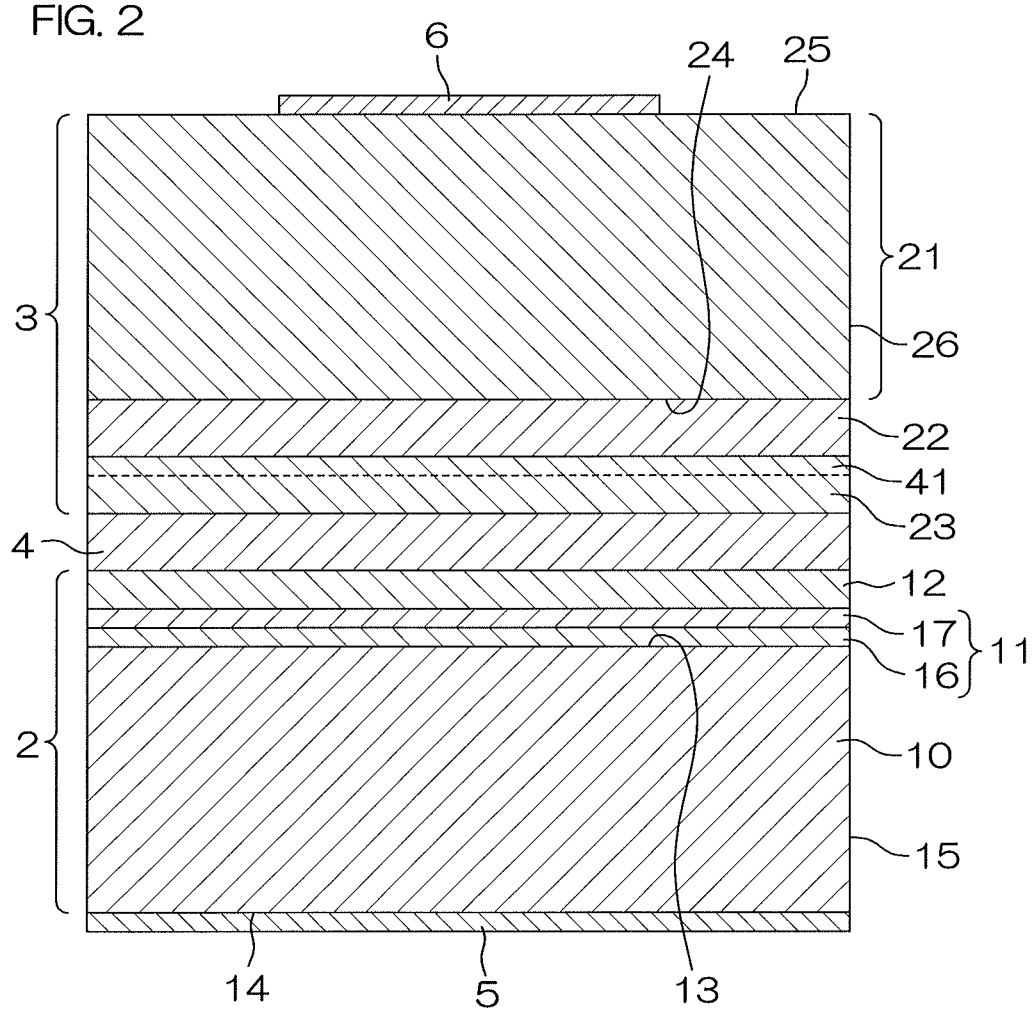
FIG. 2 is a sectional view of the semiconductor light-emitting device according to the first preferred embodiment of the present invention and shows a section taken along II-II of FIG. 1.

FIG. 1 is a plan view of a semiconductor light-emitting device 1 according to a first preferred embodiment of the present invention. FIG. 2 is a sectional view of the semiconductor light-emitting device 1 according to the first preferred embodiment of the present invention and shows a section taken along II-II of FIG. 1.

Referring to FIG. 2, the semiconductor light-emitting device 1 includes a non-light-emitting body portion 2, a light-emitting body portion 3, a bonding material layer 4, an anode electrode layer 5 (first electrode), and a cathode electrode layer 6 (second electrode). The light-emitting body portion 3 is bonded to the non-light-emitting body portion 2 via the bonding material layer 4. The semiconductor light-emitting device 1 is increased in strength by the non-light-emitting body portion 2.

The non-light-emitting body portion 2 includes a substrate 10, a base electrode layer 11, and a first light reflecting layer 12. The substrate 10 includes a first front surface 13 at one side, a first rear surface 14 at another side, and first side surfaces 15, connecting the first front surface 13 and the first rear surface 14. A thickness of the substrate 10 may be not less than 50 μm and not more than 300 μm (for example, approximately 150 μm).

The substrate 10 may include a conductor substrate made of a metal material. The conductor substrate may contain at least one type of material among Al (aluminum), Cu (copper), Au (gold), and Ag (silver) as the metal material.

In place of or in addition to the conductor substrate, the substrate 10 may include a semiconductor substrate made of a semiconductor material. The semiconductor substrate may contain at least one type of material among Si (silicon), silicon carbide (SiC), germanium (Ge), a compound semiconductor, and a nitride semiconductor as the semiconductor material. In the following, an example where the substrate 10 is constituted of a semiconductor substrate made of Si shall be described.

The base electrode layer 11 covers the first front surface 13 of the substrate 10. The base electrode layer 11 contacts the first front surface 13 of the substrate 10. The base electrode layer 11 has a laminated structure including a first base electrode layer 16 and a second base electrode layer 17 that are laminated in that order from the first front surface 13 side of the substrate 10.

The first base electrode layer 16 may contain Ti (titanium). A thickness of the first base electrode layer 16 may be not less than 0.01 μm and not more than 0.1 μm (for example, approximately 0.05 μm).

The second base electrode layer 17 may contain Au. A thickness of the second base electrode layer 17 may be not less than 0.05 μm and not more than 1.0 μm (for example, approximately 0.1 μm).

The first light reflecting layer 12 is a layer having a light reflecting property. The first light reflecting layer 12 covers the base electrode layer 11. The first light reflecting layer 12 contacts the base electrode layer 11.

In the present configuration, the first light reflecting layer 12 is constituted of a conductive light reflecting layer that contains Au. The first light reflecting layer 12 is thereby electrically connected to the substrate 10 via the base electrode layer 11. A thickness of the first light reflecting layer 12 may be not less than 0.1 µm and not more than 3.0 µm (for example, approximately 0.5 µm).

The light-emitting body portion 3 includes a compound semiconductor layer 21, a light transmitting layer 22, and a second light reflecting layer 23. The compound semiconductor layer 21 contains a quaternary material. The quaternary material may contain at least one type of material among Al, Ga (gallium), In (indium), and P (phosphorus).

In the present configuration, the compound semiconductor layer 21 generates light having a wavelength in a region between green and infrared. The light generated by the compound semiconductor layer 21 may have a wavelength of not less than 500 nm and not more than 1000 nm.

The compound semiconductor layer 21 includes a second front surface 24 at one side, a second rear surface 25 at another side, and second side surfaces 26 connecting the second front surface 24 and the second rear surface 25. The second side surface 26 of the light-emitting body portion 3 may be formed to be flush with the first side surfaces 15 of the non-light-emitting body portion 2 via the bonding material layer 4. A thickness of the compound semiconductor layer 21 may be not less than 2.5 µm and not more than 13.5 µm (for example, approximately 5.5 µm).

Figure 3:
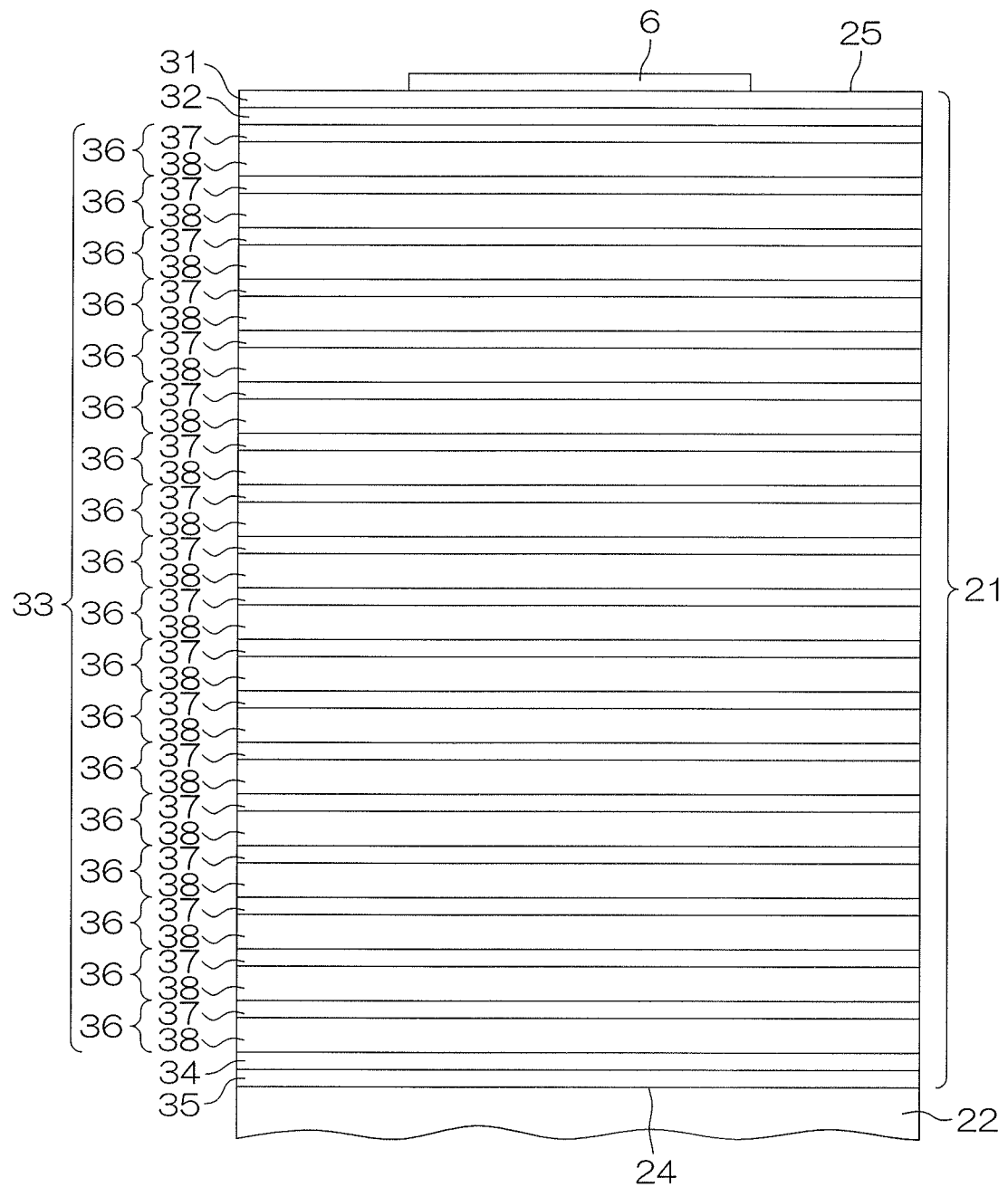
FIG. 3 is a sectional view of the structure of a semiconductor layer shown in FIG. 2.

In the present configuration, the compound semiconductor layer 21 is constituted of an epitaxial layer formed by an epitaxial growth method. Specifically, the compound semiconductor layer 21 has the structure shown in FIG. 3. FIG. 3 is a sectional view of the structure of the compound semiconductor layer 21 shown in FIG. 2.

Referring to FIG. 3, the compound semiconductor layer 21 includes an n type window layer 31, an n type cladding layer 32, a multiple-quantum well layer 33, a p type cladding layer 34, and a p type contact layer 35 that are laminated in that order from the second rear surface 25 side toward the second front surface 24 side. The multiple-quantum well layer 33 is also called an MQW layer (multi quantum well layer).

The second front surface 24 of the compound semiconductor layer 21 is formed by the p type contact layer 35. The second rear surface 25 of the compound semiconductor layer 21 is formed by the n type window layer 31.

The n type window layer 31 may contain AlInGaP. A thickness of the n type window layer 31 may be not less than 2.0 µm and not more than 5.0 µm (for example, approximately 2.5 µm).

The n type cladding layer 32 may contain AlInP. A thickness of the n type cladding layer 32 may be not less than 0.1 µm and not more than 2.5 µm (for example, approximately 1.0 µm).

The multiple-quantum well layer 33 has a laminated structure, in which a plurality (18 in the present configuration) of quantum well layers 36 are laminated. Each of the plurality of quantum well layers 36 includes a barrier layer 37 and a well layer 38 that are laminated in that order from the second rear surface 25 side of the compound semiconductor layer 21.

Each barrier layer 37 may contain AlInGaP. A thickness of the barrier layer 37 may be not less than 3.0 nm and not more than 7.0 nm (for example, approximately 3.5 nm).

Each well layer 38 may contain AlInGaP. The well layer 38 may have a thickness greater than the thickness of the barrier layer 37. The thickness of the well layer 38 may be not less than 3.0 nm and not more than 7.0 nm (for example, approximately 5.0 nm).

The p type cladding layer 34 may contain AlInP. A thickness of the p type cladding layer 34 may be not less than 0.1 µm and not more than 2.5 µm (for example, approximately 1.0 µm).

The p type contact layer 35 may contain GaP. A thickness of the p type contact layer 35 may be not less than 0.1 µm and not more than 2.5 µm (for example, approximately 1.0 µm).

Referring again to FIG. 2, the light transmitting layer 22 is a layer having a light transmitting property. Transparency or translucency is included in light transmitting property. The light transmitting layer 22 covers the second front surface 24 of the compound semiconductor layer 21. The light transmitting layer 22 contacts the second front surface 24 of the compound semiconductor layer 21.

In the present configuration, the light transmitting layer 22 is constituted of a conductive light transmitting layer that contains ITO (indium tin oxide). The light transmitting layer 22 is thereby electrically connected to the compound semiconductor layer 21 (p type contact layer 35). A thickness of the light transmitting layer 22 may be not less than 0.1 µm and not more than 0.5 µm (for example, approximately 0.3 µm).

The second light reflecting layer 23 is a layer having a light reflecting property. The second light reflecting layer 23 covers the light transmitting layer 22. The second light reflecting layer 23 contacts the light transmitting layer 22.

In the present configuration, the second light reflecting layer 23 is constituted of a conductive light reflecting layer that contains Au. The second light reflecting layer 23 is thereby electrically connected to the compound semiconductor layer 21 via the light transmitting layer 22. A thickness of the second light reflecting layer 23 may be not less than 0.1 µm and not more than 1.0 µm (for example, approximately 0.5 µm).

The light-emitting body portion 3 is disposed on the non-light-emitting body portion 2 in an orientation where the second front surface 24 of the compound semiconductor layer 21 faces the first front surface 13 of the substrate 10. In the present structure, the bonding material layer 4 is interposed in a region between the first light reflecting layer 12 and the second light reflecting layer 23.

The bonding material layer 4 is constituted of a conductive bonding material layer that contains a conductive material. The light-emitting body portion 3 is thereby electrically connected to the non-light-emitting body portion 2 via the bonding material layer 4. The bonding material layer 4 faces the light transmitting layer 22 across the second light reflecting layer 23. In a plan view of viewing from a direction normal to the first major surface 13 of the substrate 10, substantially an entirety of the bonding material layer 4 overlaps with the light transmitting layer 22.

The bonding material layer 4 has an element having a property of being high in adhesion force with respect to the light transmitting layer 22 (hereinafter referred to simply as "element of high adhesion force") more so than the element (that is, Au) constituting the second light reflecting layer 23. The bonding material layer 4 is formed as an element supply source that supplies, by diffusion, the element of high adhesion force to the second light reflecting layer 23.

A thickness of the bonding material layer 4 is less than the thickness of the second light reflecting layer 23. A ratio of the thickness of the bonding material layer 4 with respect to the thickness of the second light reflecting layer 23 (the thickness of the bonding material layer 4/the thickness of the second light reflecting layer 23) may be not less than 0.004 and not more than 0.04. The thickness of the bonding material layer 4 may be not less than 0.001 µm and not more than 0.01 µm.

A bonding material diffusion region 41 is formed in a surface layer portion of the second light reflecting layer 23 in a boundary portion between the light transmitting layer 22 and the second light reflecting layer 23. In FIG. 2, the bonding material diffusion region 41 is indicated by a broken line drawn inside the second light reflecting layer 23.

The bonding material diffusion region 41 has an element constituted of the same element species as the element contained in the bonding material layer 4 and being high in adhesion force with respect to the light transmitting layer 22. The element of high adhesion force diffuses from the bonding material layer 4 to the surface layer portion of the second light reflecting layer 23. Therefore, actually, the element of high adhesion force is diffused across substantially an entirety of the second light reflecting layer 23.

A content percentage of the element of high adhesion force inside the second light reflecting layer 23 increases as the bonding material layer 4 is approached. The content percentage of the element of high adhesion force is, more specifically, a proportion of a content of the element of high adhesion force inside the second light reflecting layer 23.

The bonding material diffusion region 41 is thus formed across substantially the entirety inside the second light reflecting layer 23. The bonding material diffusion region 41 has a concentration gradient where the content percentage of the element of high adhesion force at the light transmitting layer 22 side is lower than the content percentage of the element of high adhesion force at the bonding material layer 4 side. In the bonding material diffusion region 41, the content percentage of the element of high adhesion force at a portion contacting the light transmitting layer 22 may be more than 0% and not more than 25%.

The bonding material layer 4 may contain Cr (chromium) as the element of high adhesion force with respect to the light transmitting layer 22. The bonding material diffusion region 41 may thus contain Cr as the element of high adhesion force.

The anode electrode layer 5 is connected to the first rear surface 14 of the substrate 10. In the present preferred embodiment, the anode electrode layer 5 is formed across an entire surface of the first rear surface 14 of the substrate 10.

The cathode electrode layer 6 is connected to the second rear surface 25 of the compound semiconductor layer 21. The cathode electrode layer 6 integrally includes a pad electrode portion 67 of substantially circular shape and branch electrode portions 68, extending radially to a periphery of the pad electrode portion 67. In the present preferred embodiment, the pad electrode portion 67 is disposed at substantially a center of the light-emitting body portion 3 in plan view, and the plurality of branch electrode portions 68 extend in eight directions directed toward the four first side surfaces 15 and four corner portions of the substrate 10 from the pad electrode portion 67. As shown in FIG. 1, in the present preferred embodiment, the branch electrode portions 68 (first portions 69) directed toward the four corner portions of the substrate 10 are made longer in comparison to the branch electrode portions 68 (second portions 70) directed toward the four first side surfaces 15 of the substrate 10.

When a forward voltage of not less than a predetermined threshold voltage is applied between the cathode electrode layer 6 and the anode electrode layer 5, a red light is generated in the light-emitting body portion 3 (compound semiconductor layer 21).

The generated red light passes through the light transmitting layer 22 and is thereafter reflected by the second light reflecting layer 23 and the first light reflecting layer (mainly by the second light reflecting layer 23). The generated red light is thereby taken out from the second rear surface 25 of the compound semiconductor layer 21.

As described above, with the semiconductor light-emitting device 1, the bonding material diffusion region 41 is formed in the surface layer portion of the second light reflecting layer 23 in the boundary portion between the light transmitting layer 22 and the second light reflecting layer 23.

The bonding material diffusion region 41 has the element having the property of being high in adhesion force with respect to the light transmitting layer 22 more so than the element constituting the second light reflecting layer 23. An adhesion force of the second light reflecting layer 23 with respect to the light transmitting layer 22 can thereby be improved.

In particular, the bonding material diffusion region 41 contains Cr as the element having the property of being high in adhesion force with respect to the light transmitting layer 22. Cr is high in compatibility and adhesion force with respect to ITO in comparison to Au.

The adhesion force of the second light reflecting layer 23 with respect to the light transmitting layer 22 can thus be improved by forming the bonding material diffusion region 41, which contains Cr, at the surface layer portion of the second light reflecting layer 23 in the boundary portion between the light transmitting layer 22 and the second light reflecting layer 23.

Moreover, with the semiconductor light-emitting device 1, the bonding material layer 4 is formed to face the light transmitting layer 22 across the second light reflecting layer 23. The bonding material layer 4 thus does not have to be interposed in the boundary portion between the light transmitting layer 22 and the second light reflecting layer 23.

Shielding of light by the bonding material layer 4 can thereby be prevented in the boundary portion between the light transmitting layer 22 and the second light reflecting layer 23. Consequently, the adhesion force of the second light reflecting layer 23 with respect to the light transmitting layer 22 can be increased while maintaining reflectance of light by the second light reflecting layer 23.

Improving the adhesion force of the second light reflecting layer 23 with respect to the light transmitting layer 22 is also effective in terms of increasing a bonding strength of the non-light-emitting body portion 2 with respect to the light-emitting body portion 3.

FIG. 4A to FIG. 4K are sectional views for describing a method for manufacturing the semiconductor light-emitting device 1 shown in FIG. 2.

With the method for manufacturing the semiconductor light-emitting device 1, the non-light-emitting body portion 2 and the light-emitting body portion 3 are manufactured separately. The non-light-emitting body portion and the light-emitting body portion 3 that have been manufactured are bonded by the bonding material layer 4.

In the following, a manufacturing process of the non-light-emitting body portion 2 shall be described and thereafter, a manufacturing process of the light-emitting body portion 3 shall be described. Thereafter, a step of bonding the non-light-emitting body portion 2 and the light-emitting body portion 3 by the bonding material layer 4 shall be described.

Figure 4A:
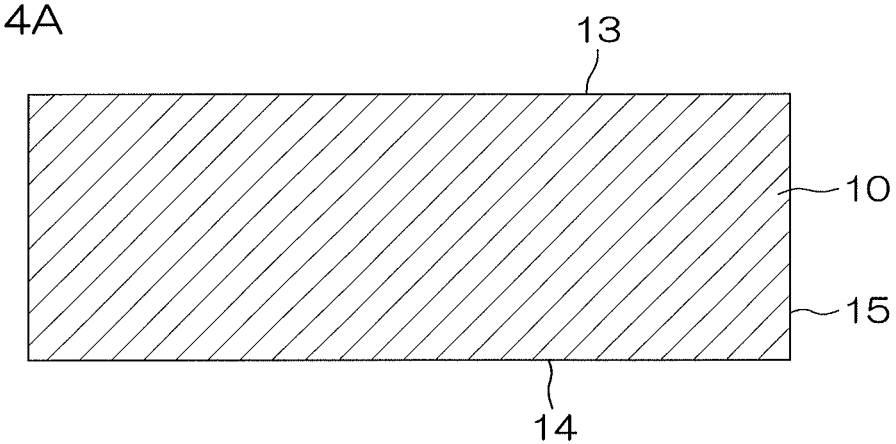
FIG. 4A is a sectional view for describing a method for manufacturing the semiconductor light-emitting device shown in FIG. 2.

Referring to FIG. 4A, in manufacturing the non-light-emitting body portion 2, first, the substrate 10, constituted of the semiconductor substrate made of Si, is prepared. The substrate 10 has the first front surface 13 and the first rear surface 14.

Figure 4B:
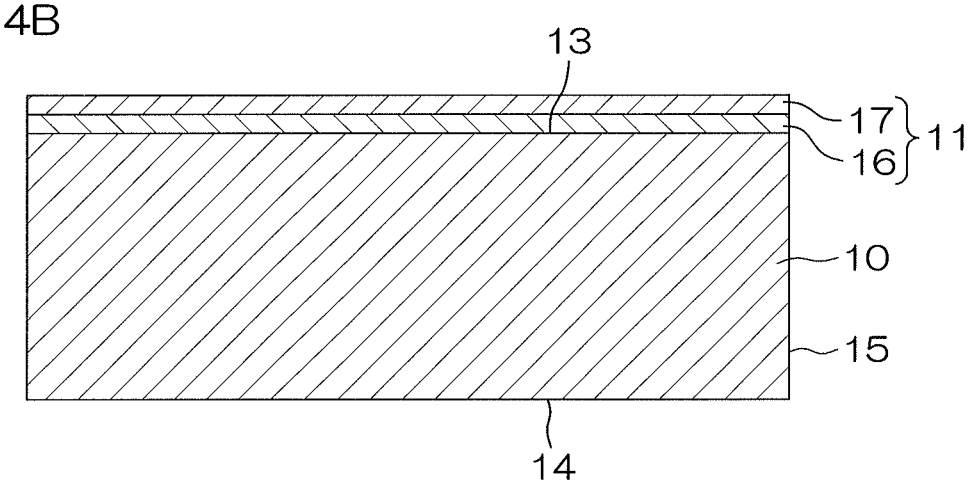
FIG. 4B is a sectional view of a step described subsequently to FIG. 4A.

Next, referring to FIG. 4B, the base electrode layer 11 is formed on the first front surface 13 of the substrate 10. A step of forming the base electrode layer 11 includes a step of laminating the first base electrode layer 16, containing Ti, and the second base electrode layer 17, containing Au, in that order from the first front surface 13 side of the substrate 10. The first base electrode layer 16 and the second base electrode layer 17 may be formed respectively by a vapor deposition method.

Figure 4C:
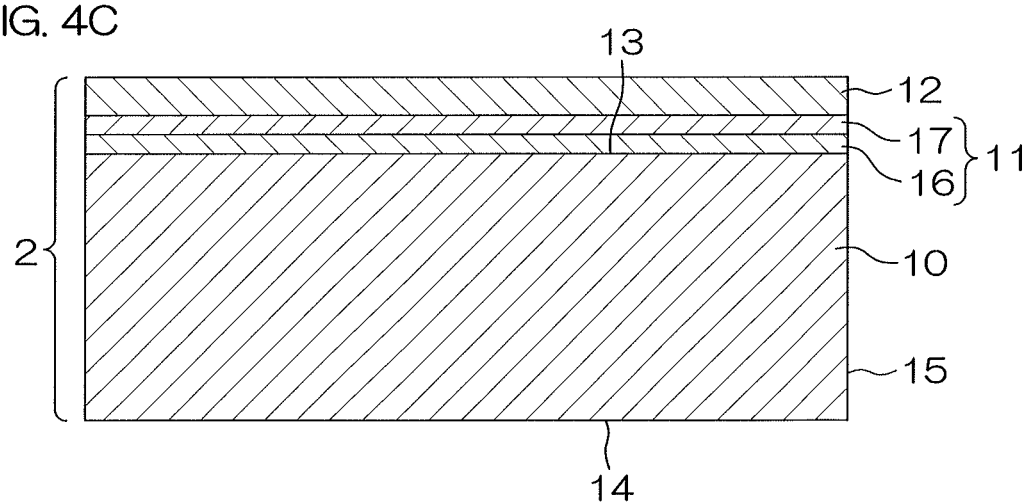
FIG. 4C is a sectional view of a step described subsequently to FIG. 4B.

Next, referring to FIG. 4C, the first light reflecting layer 12, containing Au, is formed on the base electrode layer 11. The first light reflecting layer 12 may be formed by a vapor deposition method. The non-light-emitting body portion 2 is formed through the above steps.

Figure 4D:
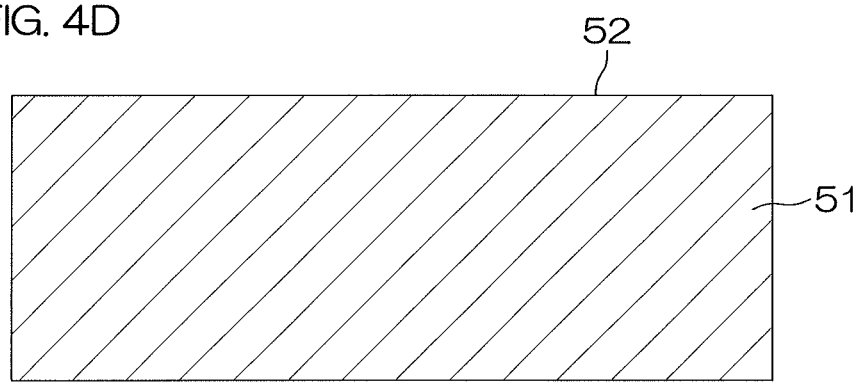
FIG. 4D is a sectional view of a step described subsequently to FIG. 4C.

Referring to FIG. 4D, in manufacturing the light-emitting body portion 3, first, a supporting substrate 51 is prepared. The supporting substrate 51 has a major surface 52. The supporting substrate 51 is a seed crystal substrate for forming the compound semiconductor layer 21. The supporting substrate 51 may be a compound semiconductor substrate made of GaAs.

Figure 4E:
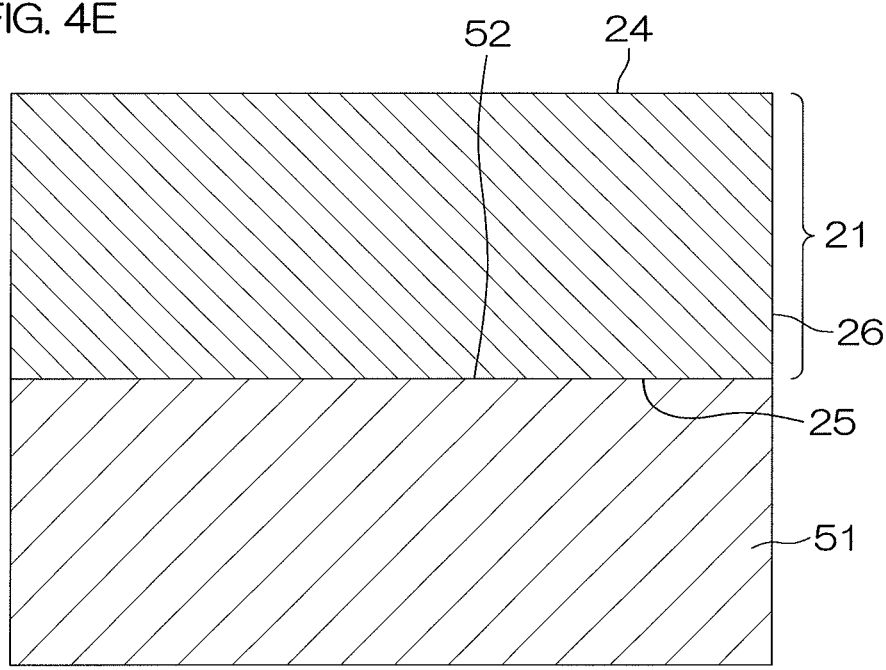
FIG. 4E is a sectional view of a step described subsequently to FIG. 4D.

Next, referring to FIG. 4E, the compound semiconductor layer 21 is formed on the major surface 52 of the supporting substrate 51 by an epitaxial growth method. The step of forming the compound semiconductor layer 21 includes a step of forming the n type window layer 31, the n type cladding layer 32, the multiple-quantum well layer 33, the p type cladding layer 34, and the p type contact layer 35 in that order from the major surface 52 side of the supporting substrate 51 by the epitaxial growth method.

Figure 4F:
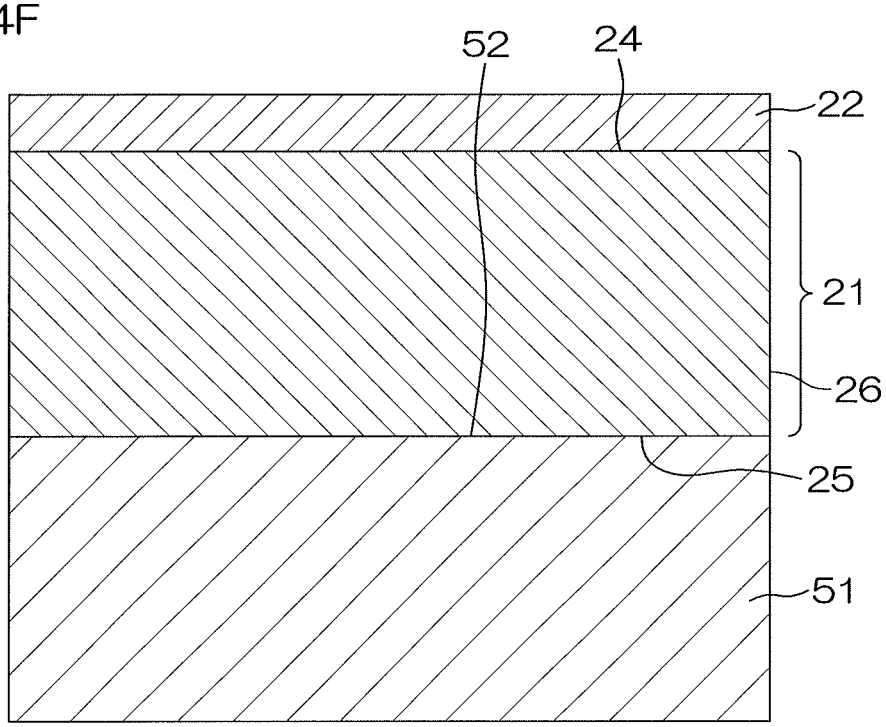
FIG. 4F is a sectional view of a step described subsequently to FIG. 4E.

Next, referring to FIG. 4F, the light transmitting layer 22, containing ITO, is formed on the compound semiconductor layer 21. The light transmitting layer 22 may be formed by a vapor deposition method or a sputtering method.

Figure 4G:
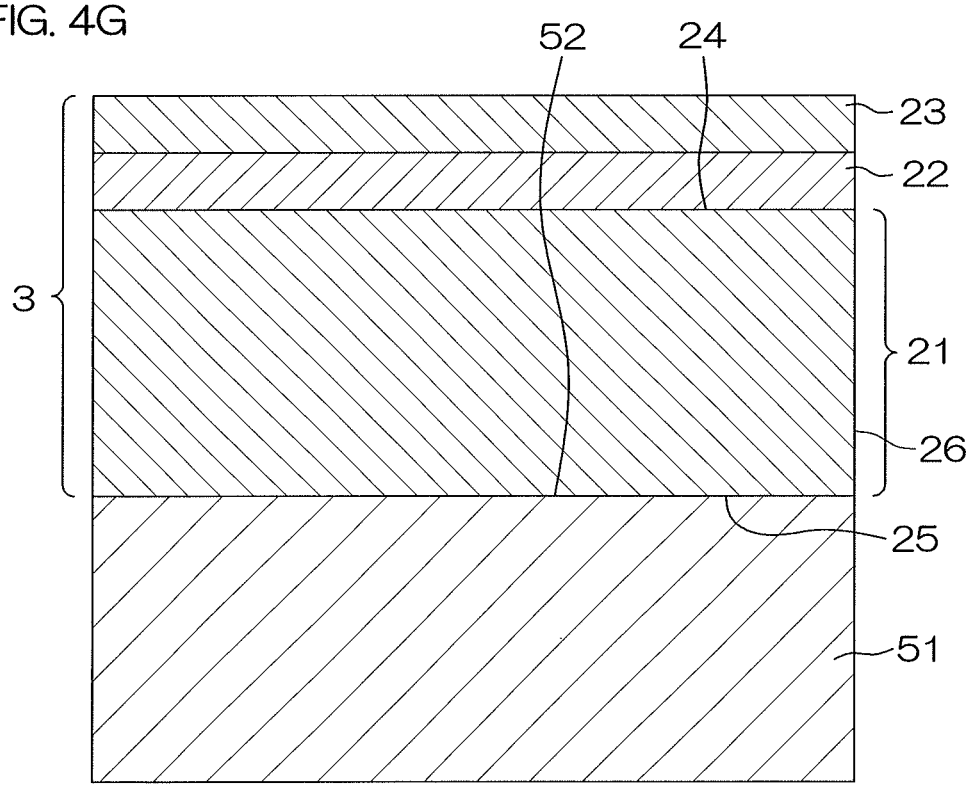
FIG. 4G is a sectional view of a step described subsequently to FIG. 4F.

Next, referring to FIG. 4G, the second light reflecting layer 23, containing Au, is formed on the light transmitting layer 22. The second light reflecting layer 23 may be formed by a vapor deposition method. The light-emitting body portion 3 is formed through the above steps.

Next, referring to FIG. 4H, the bonding material layer 4, containing Cr, is formed on the second light reflecting layer 23. The bonding material layer 4 may be formed by a vapor deposition method.

Next, referring to FIG. 4I, the light-emitting body portion 3 is bonded to the non-light-emitting body portion 2. The light-emitting body portion 3 is disposed on the non-light-emitting body portion 2 in an orientation where the bonding material layer 4 is interposed between the first light reflecting layer 12 and the second light reflecting layer 23.

Next, the non-light-emitting body portion 2 and the light-emitting body portion 3 are thermocompression-bonded via the bonding material layer 4. A heating temperature may be not less than 250° C. and not more than 350° C. A pressure may be not less than 35 kN and not more than 45 kN. A thermocompression time may be not less than 5 minutes and not more than 20 minutes.

The present step includes a step of making the Cr constituting the bonding material layer 4 diffuse to the second light reflecting layer 23. The present step is continued until the Cr reaches the surface layer portion of the second light reflecting layer 23.

A diffusion amount and a diffusion range of the Cr with respect to the second light reflecting layer 23 can be controlled by adjusting such conditions as the heating temperature, the pressure, and/or the thermocompression time, etc.

Through such a step, the bonding material diffusion region 41 is formed in the surface layer portion of the second light reflecting layer 23 in the boundary portion between the light transmitting layer 22 and the second light reflecting layer 23. The adhesion force of the second light reflecting layer 23 with respect to the light transmitting layer 22 is increased by the bonding material diffusion region 41.

Figure 4J:
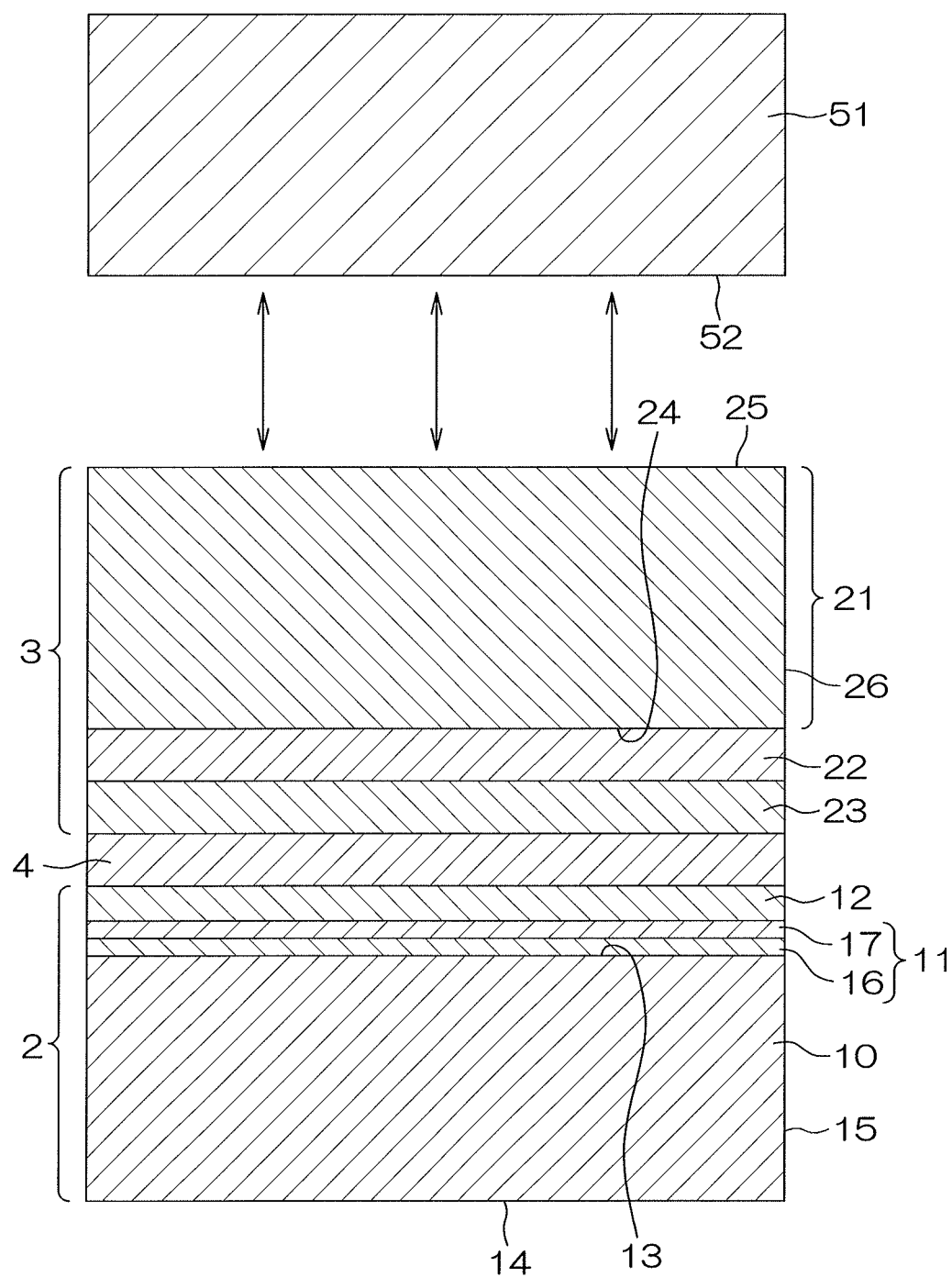
FIG. 4J is a sectional view of a step described subsequently to FIG. 4I.

Next, referring to FIG. 4J, the supporting substrate 51 is removed from the light-emitting body portion 3. The supporting substrate 51 may be removed by etching (for example, wet etching) or by grinding.

Thereby, a surface of the compound semiconductor layer 21 covered by the light transmitting layer 22 becomes the second front surface 24 and a surface that is exposed by removal of the supporting substrate 51 becomes the second rear surface 25.

Figure 4K:
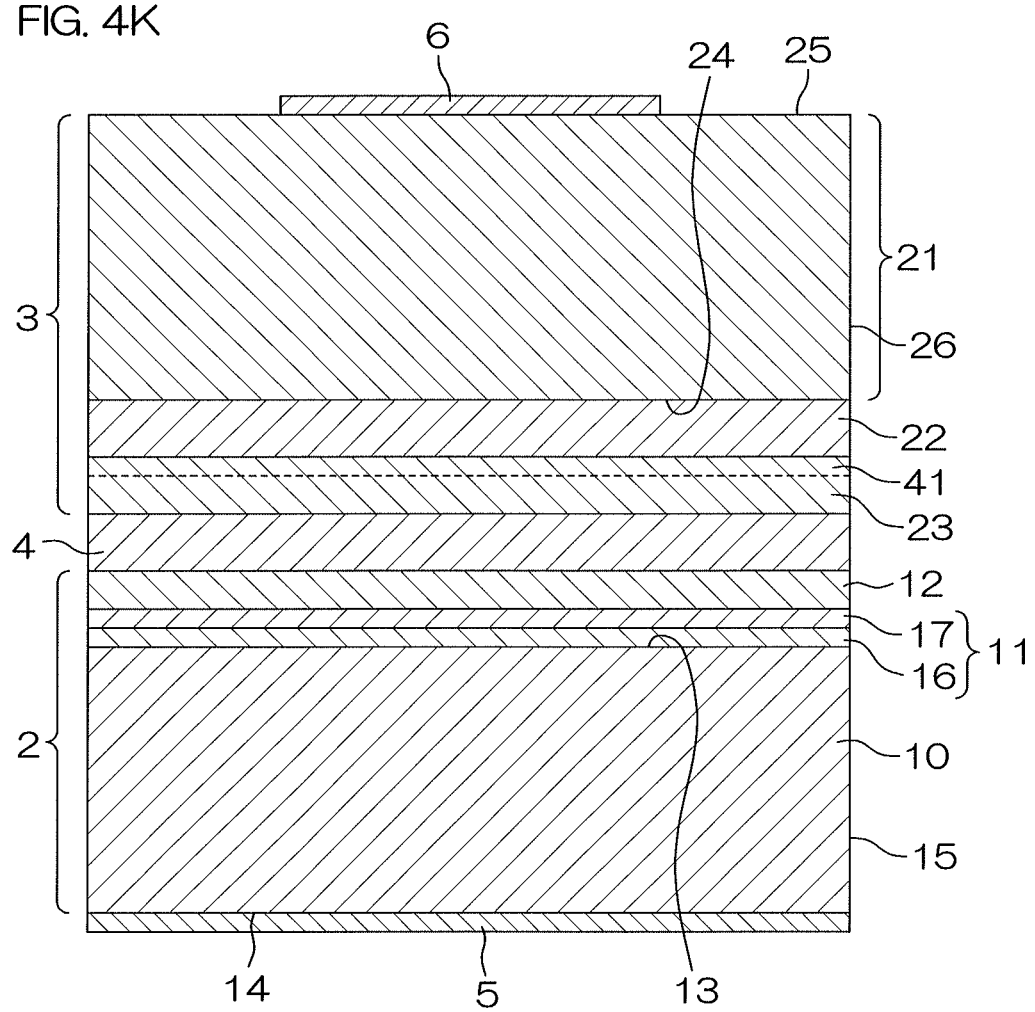
FIG. 4K is a sectional view of a step described subsequently to FIG. 4J.

Next, referring to FIG. 4K, the anode electrode layer 5 is formed on the first rear surface 14 of the substrate 10. Also, the cathode electrode layer 6 is connected to the second rear surface 25 of the compound semiconductor layer 21. The semiconductor light-emitting device 1 is manufactured through steps including the above.

Figure 5:
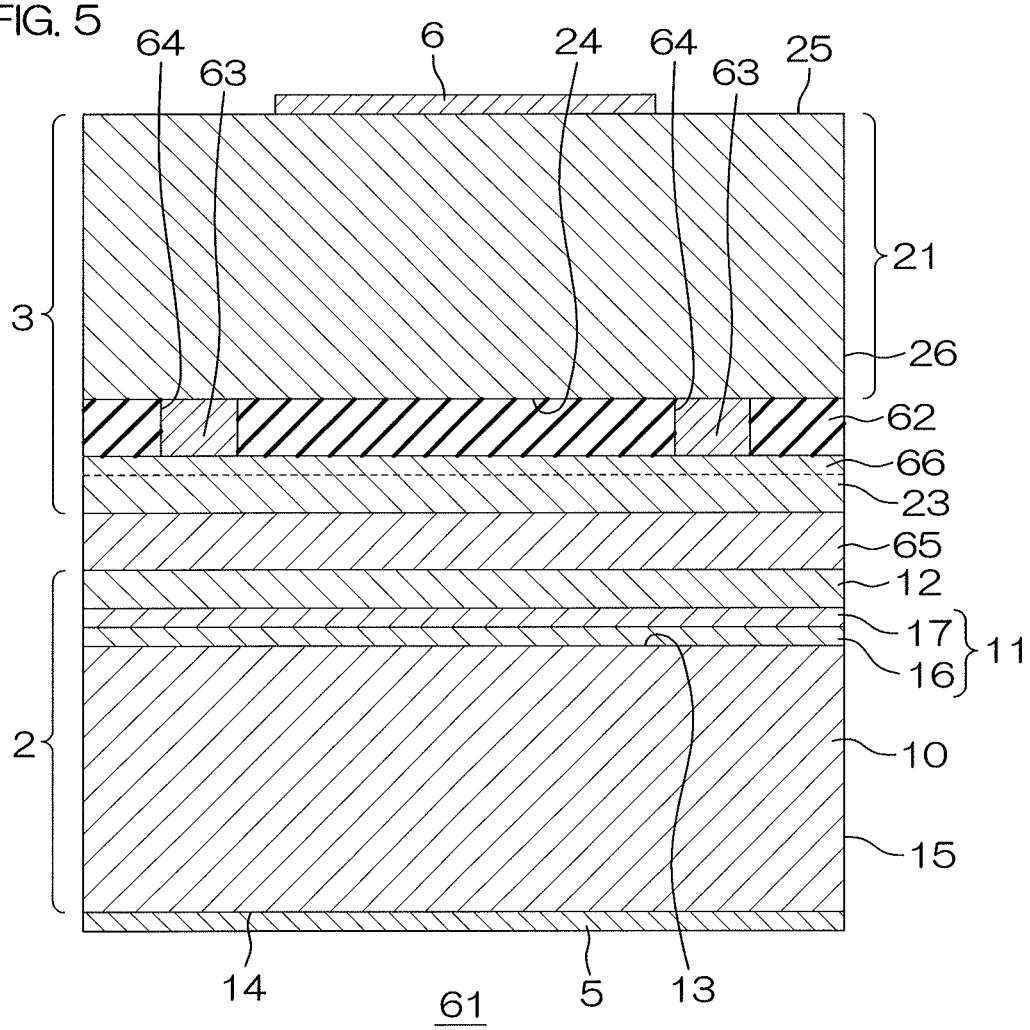
FIG. 5 is a sectional view of a semiconductor light-emitting device according to a second preferred embodiment of the present invention.

FIG. 5 is a sectional view of a semiconductor light-emitting device 61 according to a second preferred embodiment of the present invention. In the following, structures corresponding to structures described for the semiconductor light-emitting device 1 shall be provided with the same reference symbols and description thereof shall be omitted.

The semiconductor light-emitting device 61 includes a light transmitting layer 62 with an insulating property in place of the light transmitting layer 22 with the conductive property. The light transmitting layer 62 may be constituted of a single layer structure that includes a single insulating material layer. The light transmitting layer 62 may have a laminated structure, in which a plurality of insulating material layers are laminated.

The light transmitting layer 62 may contain one of either or both of $SiO_2$ (silicon oxide) and SiN (silicon nitride). In the following, an example where the light transmitting layer 62 is constituted of a single layer structure that contains $SiO_2$ shall be described.

Contact electrodes 63 are formed in the light transmitting layer 62. The contact electrodes 63 may contain Au. The contact electrodes 63 electrically connect the compound semiconductor layer 21 and the second light reflecting layer 23. The contact electrodes 63 are embedded in contact holes 64 formed in the light transmitting layer 62.

The contact electrodes 63 may be formed in regions not overlapping with the anode electrode layer 5 in the plan view of viewing from the direction normal to the first front surface 13 of the substrate 10.

The semiconductor light-emitting device 61 includes a bonding material layer 65 in place of the bonding material layer 4. The bonding material layer 65 is constituted of a conductive bonding material layer that contains a conductive material. The light-emitting body portion 3 is thereby electrically connected to the non-light-emitting body portion 2 via the bonding material layer 65.

The bonding material layer 65 faces the light transmitting layer 62 across the second light reflecting layer 23. In the plan view of viewing from the direction normal to the first major surface 13 of the substrate 10, substantially an entirety of the bonding material layer 65 overlaps with the light transmitting layer 62.

The bonding material layer 65 has an element having a property of being high in adhesion force with respect to the light transmitting layer 62 (hereinafter referred to simply as "element of high adhesion force") more so than the element (that is, Au) constituting the second light reflecting layer 23. The bonding material layer 65 is formed as an element supply source that supplies, by diffusion, the element of high adhesion force to the second light reflecting layer 23.

A thickness of the bonding material layer 65 may be not less than the thickness of the second light reflecting layer 23. A thickness of the bonding material layer 65 may be less than the thickness of the second light reflecting layer 23.

A ratio of the thickness of the bonding material layer 65 with respect to the thickness of the second light reflecting layer 23 may be not less than 0.5 and not more than 5.0. The thickness of the bonding material layer 65 may be not less than 0.05 µm and not more than 0.25 µm.

A bonding material diffusion region 66 is formed in a surface layer portion of the second light reflecting layer 23 in a boundary portion between the light transmitting layer 62 and the second light reflecting layer 23. In FIG. 5, the bonding material diffusion region 66 is indicated by a broken line drawn inside the second light reflecting layer 23.

The bonding material diffusion region 66 has an element constituted of the same element species as the element contained in the bonding material layer 65 and being high in adhesion force with respect to the light transmitting layer 62. The element of high adhesion force diffuses from the bonding material layer 65 to the surface layer portion of the second light reflecting layer 23. Therefore, actually, the element of high adhesion force is diffused across substantially an entirety of the second light reflecting layer 23.

The content percentage of the element of high adhesion force inside the second light reflecting layer 23 increases as the bonding material layer 65 is approached. The content percentage of the element of high adhesion force is, more specifically, the proportion of the content of the element of high adhesion force with respect to the second light reflecting layer 23.

The bonding material diffusion region 66 is thus formed across substantially the entirety inside the second light reflecting layer 23. Also, the bonding material diffusion region 66 has a concentration gradient where the content percentage of the element of high adhesion force at the light transmitting layer 62 side is lower than the content percentage of the element of high adhesion force at the bonding material layer 65 side. In the bonding material diffusion region 66, the content percentage of the element of high adhesion force at a portion contacting the light transmitting layer 62 may be more than 0% and not more than 5%.

The bonding material layer 65 may contain an AuBe (gold-beryllium) alloy. The Be of the AuBe alloy diffuses into the second light reflecting layer 23 as the element of high adhesion force with respect to the light transmitting layer 62. The bonding material diffusion region 66 may thus contain Be as the element of high adhesion force.

A mass ratio of Au in the bonding material layer 65 may be not less than 95% and not more than 99% (for example, approximately 98%). A mass ratio of Be in the bonding material layer 65 may be not less than 1% and not more than 5% (for example, approximately 2%).

As described above, with the semiconductor light-emitting device 61, the bonding material diffusion region 66 is formed in the surface layer portion of the second light reflecting layer 23 in the boundary portion between the light transmitting layer 62 and the second light reflecting layer 23.

The bonding material diffusion region 66 has the element having the property of being high in adhesion force with respect to the light transmitting layer 62 more so than the element constituting the second light reflecting layer 23. The adhesion force of the second light reflecting layer 23 with respect to the light transmitting layer 62 can thereby be improved.

In particular, the bonding material diffusion region 66 contains the AuBe alloy containing the element having the property of being high in adhesion force with respect to the light transmitting layer 62. The Be of the AuBe alloy is high in compatibility and adhesion force with respect to $SiO_2$ and SiN in comparison to Au.

The adhesion force of the second light reflecting layer 23 with respect to the light transmitting layer 62 can thus be improved by forming the bonding material diffusion region 66, which contains Be, at the surface layer portion of the second light reflecting layer 23 in the boundary portion between the light transmitting layer 62 and the second light reflecting layer 23.

Moreover, with the semiconductor light-emitting device 61, the bonding material layer 65 is formed to face the light transmitting layer 62 across the second light reflecting layer 23. The bonding material layer 65 thus does not have to be interposed in the boundary portion between the light transmitting layer 62 and the second light reflecting layer 23.

Shielding of light by the bonding material layer 65 can thereby be prevented in the boundary portion between the light transmitting layer 62 and the second light reflecting layer 23. Consequently, the adhesion force of the second light reflecting layer 23 with respect to the light transmitting layer 62 can be increased while maintaining reflectance of light by the second light reflecting layer 23.

Improving the adhesion force of the second light reflecting layer 23 with respect to the light transmitting layer 62 is also effective in terms of increasing the bonding strength of the non-light-emitting body portion 2 with respect to the light-emitting body portion 3.

FIG. 6A to FIG. 6F are sectional views for describing a method for manufacturing the semiconductor light-emitting device 61 shown in FIG. 5. In the method for manufacturing the semiconductor light-emitting device 61, the steps shown in FIG. 6A to FIG. 6F are carried out in place of those shown in FIG. 4D to FIG. 4I described above. The other steps are substantially the same and description thereof shall thus be omitted.

Figure 6A:
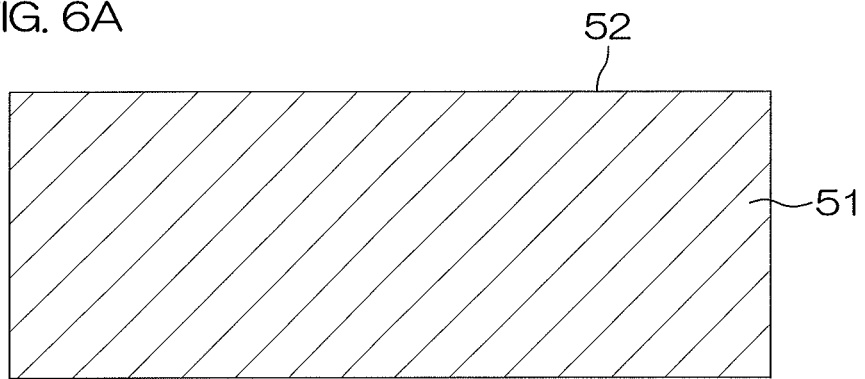
FIG. 6A is a sectional view for describing a method for manufacturing the semiconductor light-emitting device shown in FIG. 5.

First, referring to FIG. 6A, the supporting substrate 51 is prepared. The supporting substrate 51 has the major surface 52. The supporting substrate 51 is the seed crystal substrate for forming the compound semiconductor layer 21. The supporting substrate 51 may be a compound semiconductor substrate made of GaAs.

Figure 6B:
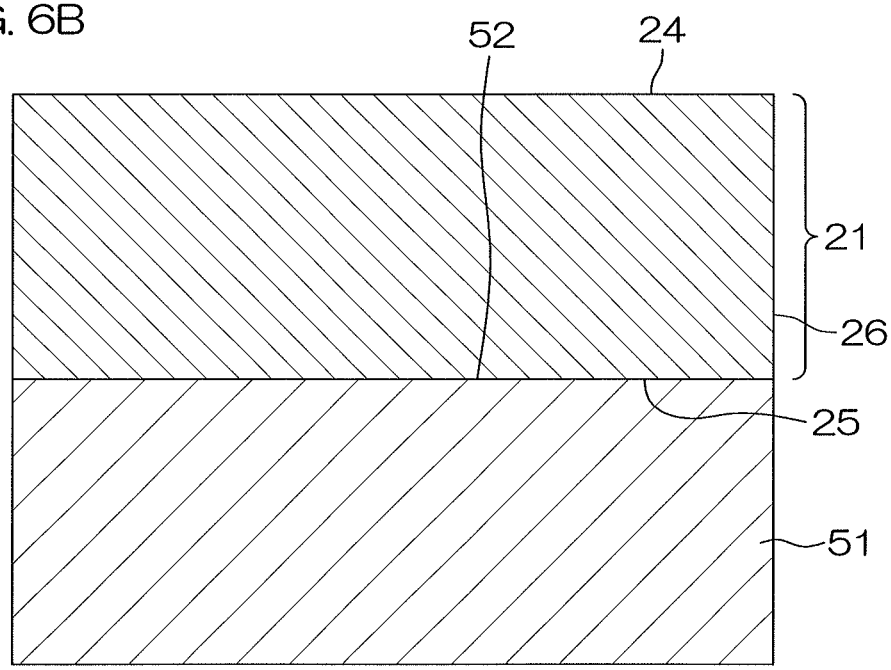
FIG. 6B is a sectional view of a step described subsequently to FIG. 6A.

Next, referring to FIG. 6B, the compound semiconductor layer 21 is formed on the major surface 52 of the supporting substrate 51 by the epitaxial growth method. The step of forming the compound semiconductor layer 21 includes a step of forming the n type window layer 31, the n type cladding layer 32, the multiple-quantum well layer 33, the p type cladding layer 34, and the p type contact layer 35 in that order from the major surface 52 side of the supporting substrate 51 by the epitaxial growth method.

Figure 6C:
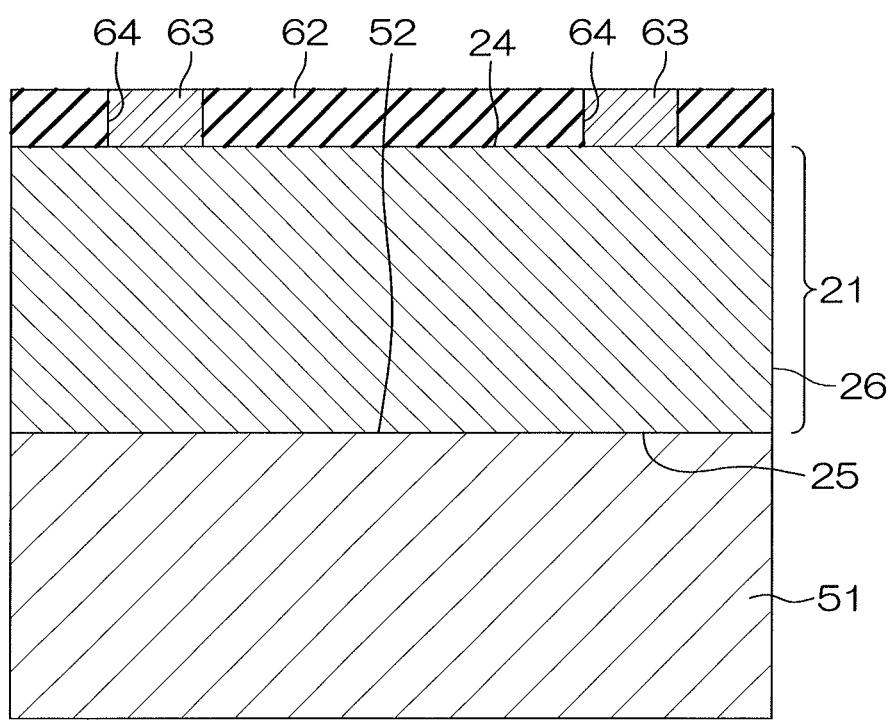
FIG. 6C is a sectional view of a step described subsequently to FIG. 6B.

Next, referring to FIG. 6C, the light transmitting layer 62, containing $SiO_2$ and/or SiN, is formed on the compound semiconductor layer 21. The light transmitting layer 62 may be formed by a vapor deposition method.

Next, the contact holes 64, exposing the compound semiconductor layer 21, are formed selectively in the light transmitting layer 62. The contact holes 64 may be formed by etching (for example, wet etching) via a mask. Next, the contact electrodes 63, containing Au, are embedded in the contact holes 64.

Figure 6D:
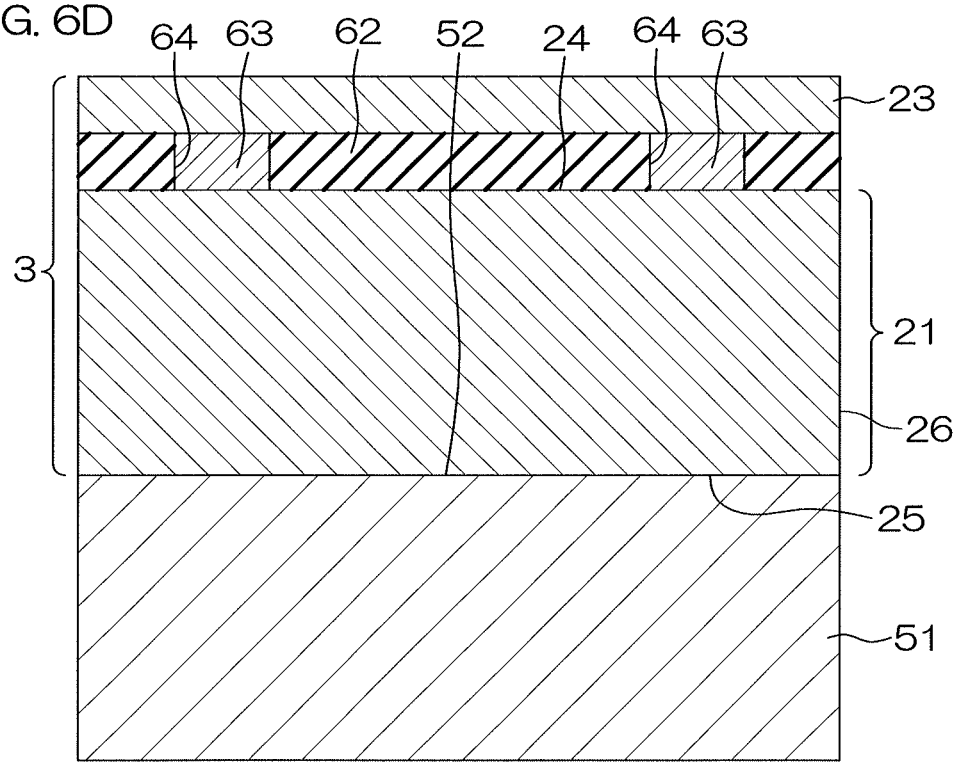
FIG. 6D is a sectional view of a step described subsequently to FIG. 6C.

Next, referring to FIG. 6D, the second light reflecting layer 23, containing Au, is formed on the light transmitting layer 62. The second light reflecting layer 23 may be formed by a vapor deposition method. The light-emitting body portion 3 is formed through the above steps.

Figure 6E:
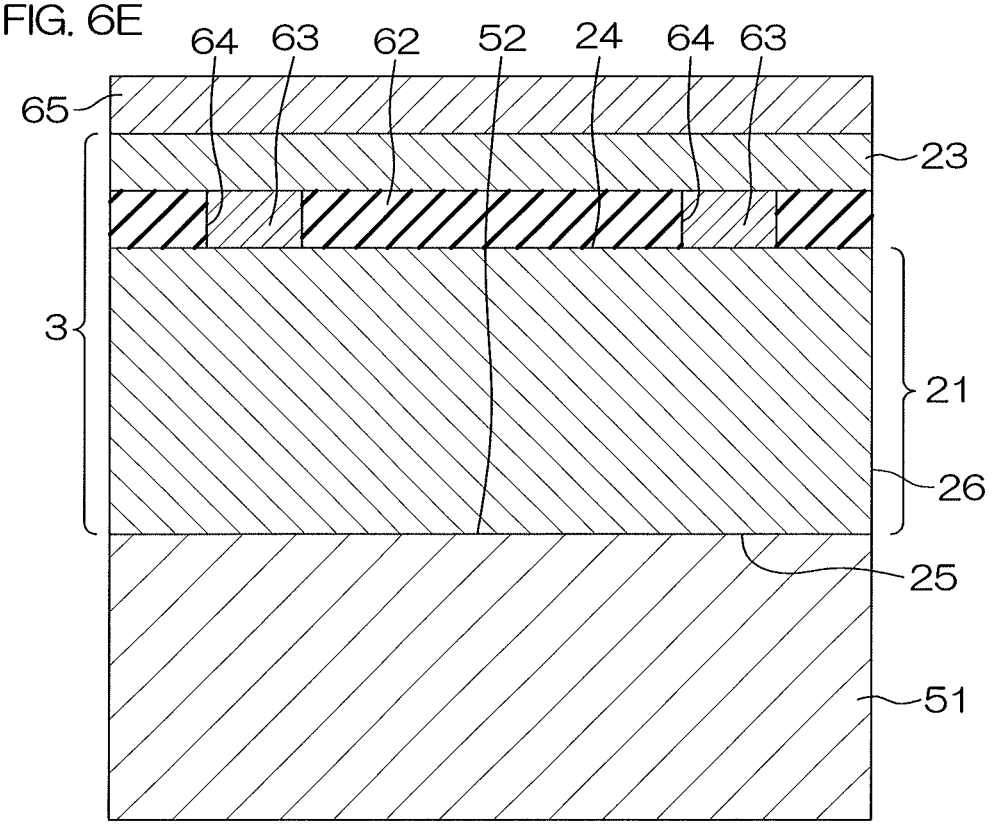
FIG. 6E is a sectional view of a step described subsequently to FIG. 6D.

Next, referring to FIG. 6E, the bonding material layer 65, containing the AuBe alloy, is formed on the second light reflecting layer 23. The bonding material layer 65 may be formed by a vapor deposition method.

Next, referring to FIG. 6F, the light-emitting body portion 3 is bonded to the non-light-emitting body portion 2. The light-emitting body portion 3 is disposed on the non-light-emitting body portion 2 in an orientation where the bonding material layer 65 is interposed between the first light reflecting layer 12 and the second light reflecting layer 23.

Next, the non-light-emitting body portion 2 and the light-emitting body portion 3 are thermocompression-bonded via the bonding material layer 65. The heating temperature may be not less than 250° C. and not more than 350° C. The pressure may be not less than 35 kN and not more than 45 kN. The thermocompression time may be not less than 5 minutes and not more than 20 minutes.

The present step includes a step of making the Be of the AuBe alloy constituting the bonding material layer 65 diffuse to the second light reflecting layer 23. The present step is continued until the Be reaches the surface layer portion of the second light reflecting layer 23.

A diffusion amount and a diffusion range of the Be with respect to the second light reflecting layer 23 can be controlled by adjusting such conditions as the heating temperature, the pressure, and/or the thermocompression time, etc.

Through such a step, the bonding material diffusion region 66 is formed in the surface layer portion of the second light reflecting layer 23 in the boundary portion between the light transmitting layer 62 and the second light reflecting layer 23. The adhesion force of the second light reflecting layer 23 with respect to the light transmitting layer 62 is increased by the bonding material diffusion region 66.

Thereafter, the same steps as the steps shown in FIG. 4J to FIG. 4K are executed. The semiconductor light-emitting device 61 is manufactured through steps including the above.

FIG. 7 is a sectional view of a semiconductor light-emitting device 71 according to a third preferred embodiment of the present invention. In the following, structures corresponding to structures described for the semiconductor light-emitting device 1 shall be provided with the same reference symbols and description thereof shall be omitted.

In the semiconductor light-emitting device 71, the base electrode layer 11 of the non-light-emitting body portion 2 has a laminated structure including the first base electrode layer 16, the second base electrode layer 17, and a third base electrode layer 72 that are laminated in that order from the first front surface 13 side of the substrate 10.

The third base electrode layer 72 may contain Ti. A thickness of the third base electrode layer 72 may be not less than 0.1 μm and not more than 2.0 μm (for example, approximately 0.6 μm).

The base electrode layer 11 is formed by laminating the first base electrode layer 16, containing Ti, the second base electrode layer 17, containing Au, and the third base electrode layer 72, containing Ti, in that order from the first front surface 13 side of the substrate 10 (see also FIG. 4B). The first base electrode layer 16, the second base electrode layer 17, and the third base electrode layer 72 may be formed respectively by a vapor deposition method.

Even with such a structure, the same effects as the effects described above for the semiconductor light-emitting device 1 can be exhibited. The structure in which the base electrode layer 11 includes the first base electrode layer 16, the second base electrode layer 17, and the third base electrode layer 72 can also be applied to the semiconductor light-emitting device 61 described above.

Figure 9:
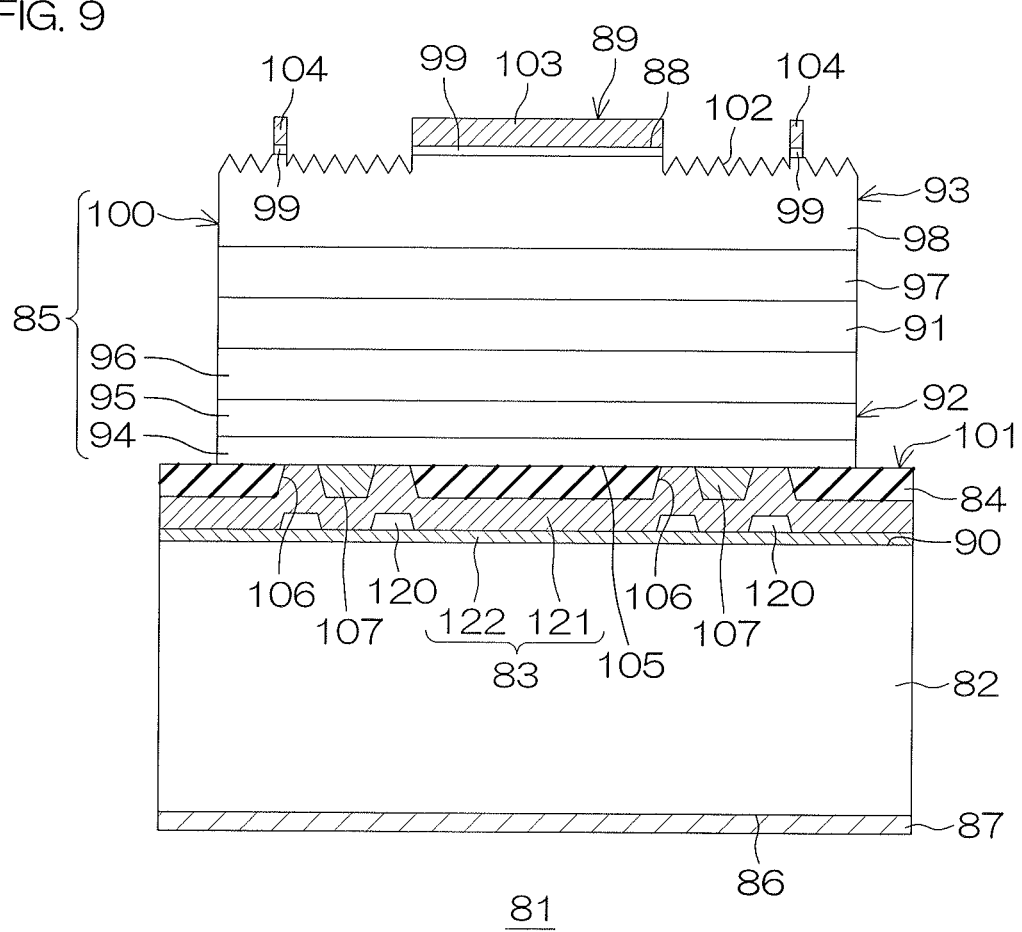
FIG. 9 is a sectional view of the semiconductor light-emitting device according to the fourth preferred embodiment of the present invention and shows a section taken along IX-IX of FIG. 8.

FIG. 8 is a plan view of a semiconductor light-emitting device 81 according to a fourth preferred embodiment of the present invention. FIG. 9 is a sectional view of the semiconductor light-emitting device 81 according to the fourth preferred embodiment of the present invention and shows a section taken along IX-IX of FIG. 8.

The semiconductor light-emitting device 81 includes a substrate 82, a light reflecting layer 83 on the substrate 82, a light transmitting layer 84 on the light reflecting layer 83, a compound semiconductor layer 85, as an example of a semiconductor layer of the present invention, on the light transmitting layer 84, an anode electrode layer 87 (first electrode), formed such as to contact a first rear surface 86 (surface at an opposite side to the compound semiconductor layer 85) of the substrate 82, and a cathode electrode layer 89 (second electrode), formed such as to contact a second rear surface 88 of the compound semiconductor layer 85.

The substrate 82 may include a conductor substrate made of a metal material. The conductor substrate may contain at least one type of material among Al (aluminum), Cu (copper), Au (gold), and Ag (silver) as the metal material.

In place of or in addition to the conductor substrate, the substrate 82 may include a semiconductor substrate made of a semiconductor material. The semiconductor substrate may contain at least one type of material among Si (silicon), silicon carbide (SiC), germanium (Ge), a compound semiconductor, and a nitride semiconductor as the semiconductor material. In the following, an example where the substrate 82 is constituted of a semiconductor substrate made of Si shall be described.

As shown in FIG. 9, the light reflecting layer 83 is formed to cover an entirety of a first front surface 90 of the substrate 82. As shall be described below, in the present preferred embodiment, the light reflecting layer 83 is formed by bonding together a first layer 121 (to be described below) and a second layer 122 (to be described below) by bonding of a growth substrate 126 (to be described below) and the substrate 82. Thus, although a boundary (bonding surface) between the first layer 121 and the second layer 122 is indicated for convenience in FIG. 9, the boundary does not have to be clearly visible.

The light transmitting layer 84 is constituted, for example, of an insulating material. For example, the light transmitting layer 84 may be constituted of a single layer structure that includes a single insulating material layer or may have a laminated structure, in which a plurality of insulating material layers are laminated. In the present preferred embodiment, the light transmitting layer 84 may contain one of either or both of $SiO_2$ (silicon oxide) and SiN (silicon nitride). In the following, an example where the light transmitting layer 84 is constituted of a single layer structure that contains $SiO_2$ shall be described.

In the present configuration, the compound semiconductor layer 85 is constituted of an epitaxial layer formed by an epitaxial growth method.

Specifically, the compound semiconductor layer 85 includes a light-emitting layer 91, a p type semiconductor layer 92, and an n type semiconductor layer 93. The p type semiconductor layer 92 is disposed at the substrate 82 side with respect to the light-emitting layer 91, and the n type semiconductor layer 93 is disposed at the cathode electrode layer 89 side with respect to the light-emitting layer 91. The light-emitting layer 91 is thus sandwiched by the p type semiconductor layer 92 and the n type semiconductor layer 93 and double heterojunction is formed. Into the light-emitting layer 91, electrons are implanted from the n type semiconductor layer 93 and positive holes are implanted from the p type semiconductor layer 92. The arrangement is such that light is generated by recombination of these in the light-emitting layer 91.

The p type semiconductor layer 92 is arranged by laminating, successively from the substrate 82 side, a p type contact layer 94 (with a thickness, for example, of not less than 0.1 μm and not more than 2.5 μm), a p type window layer 95 (with a thickness, for example, of not less than 0.1 μm and not more than 2.5 μm), and a p type cladding layer 96 (with a thickness, for example, of not less than 0.1 μm and not more than 2.5 μm). On the other hand, the n type semiconductor layer is arranged by laminating, successively on the light-emitting layer 91, an n type cladding layer 97 (with a thickness, for example, of not less than 0.1 μm and not more than 2.5 μm), an n type window layer 98 (with a thickness, for example, of not less than 2.0 μm and not more than 5.0 μm), and an n type contact layer 99 (with a thickness, for example, of not less than 0.1 μm and not more than 2.5 μm).

The p type contact layer 94 and the n type contact layer 99 are low resistance layers for making ohmic contact with anode side contact layers 107 (to be described below) and the cathode electrode layer 89, respectively. The p type contact layer 94 may be made a p type semiconductor by doping, for example, C (carbon) as a p type dopant to a high concentration into GaP. Also, the n type contact layer 99 may be made an n type semiconductor layer by doping, for example, Si as an n type dopant to a high concentration into GaAs.

The p type window layer 95 may be made a p type semiconductor by doping, for example, Mg as a p type dopant into GaP. On the other hand, the n type window layer 98 may be made an n type semiconductor layer by doping, for example, Si as an n type dopant into AlInGaP.

The p type cladding layer 96 may be made a p type semiconductor by doping, for example, Mg as a p type dopant into AlInP. On the other hand, the n type cladding layer 97 may be made an n type semiconductor layer by doping, for example, Si as an n type dopant into AlInP.

The light-emitting layer 91 has, for example, an MQW (multiple-quantum well) structure that contains InGaP and is a layer arranged such that light is generated by the recombination of electrons and positive holes and the generated light is amplified. More specifically, the light-emitting layer 91 may have the multiple-quantum well (MQW) structure shown in FIG. 3.

As shown in FIG. 8 and FIG. 9, a portion of the semiconductor light-emitting device 81 is removed to form a mesa portion 100. More specifically, the n type semiconductor layer 93, the light-emitting layer 91, and the p type semiconductor layer 92 are removed by etching from a front surface of the compound semiconductor layer 85 across an entire periphery of the compound semiconductor layer 85 to form the mesa portion 100 of substantially quadrilateral shape in lateral sectional view. The shape of the mesa portion 100 is not restricted to a substantially quadrilateral shape in lateral sectional view and may, for example, be a trapezoidal shape. The light transmitting layer 84 thereby constitutes a lead-out portion 101 that is led out in a lateral direction from the mesa portion 100. As shown in FIG. 8, the mesa portion 100 is surrounded by the lead-out portion 101 in plan view.

Fine uneven shapes 102 are formed on a surface of the mesa portion 100 (second rear surface 88 of the compound semiconductor layer 85). Light taken out from the compound semiconductor layer 85 can be diffused by the fine uneven shapes 102. As shall be described below, with the present preferred embodiment, the n type window layer 98 is exposed by the n type contact layer 99 being removed selectively in accordance with a shape of the cathode electrode layer 89 and the fine uneven shapes 102 are formed on the exposed surface. In FIG. 8, the fine uneven shapes 102 are omitted for the sake of clarity.

In the present preferred embodiment, the anode electrode layer 87 arranged as a rear surface electrode is constituted of Au or an alloy that contains Au. Specifically, it may be a laminated structure indicated as (substrate 82 side) Ti/Au. Also, the anode electrode layer 87 is formed such as to cover an entirety of the first rear surface 86 of the substrate 82.

In the present preferred embodiment, the cathode electrode layer 89 arranged as a front surface electrode is constituted of Au or an alloy that contains Au. Specifically, it may be a laminated structure indicated as (compound semiconductor layer 85 side) AuGeNi/Au.

Also, the cathode electrode layer 89 integrally includes a pad electrode portion 103 and branch electrode portions 104, extending selectively in branch shapes from the pad electrode portion 103 such as to demarcate certain regions in a periphery of the pad electrode portion 103.

In the present preferred embodiment, the pad electrode portion 103 is disposed at substantially a center of the mesa portion 100 in plan view. Branch electrode portions 104, extending in a cross shape from the pad electrode portion 103 toward respective peripheral edges of the mesa portion 100, and branch electrode portions 104, intersecting two of the branch electrode portions 104 of cross shape and extending along two of the peripheral edges of the mesa portion 100, are formed. And, in the present preferred embodiment, by the n type contact layer 99 having the same shape as the cathode electrode layer 89, the n type window layer 98 is exposed from a region other than a region in which the cathode electrode layer 89 is formed.

Figure 10:
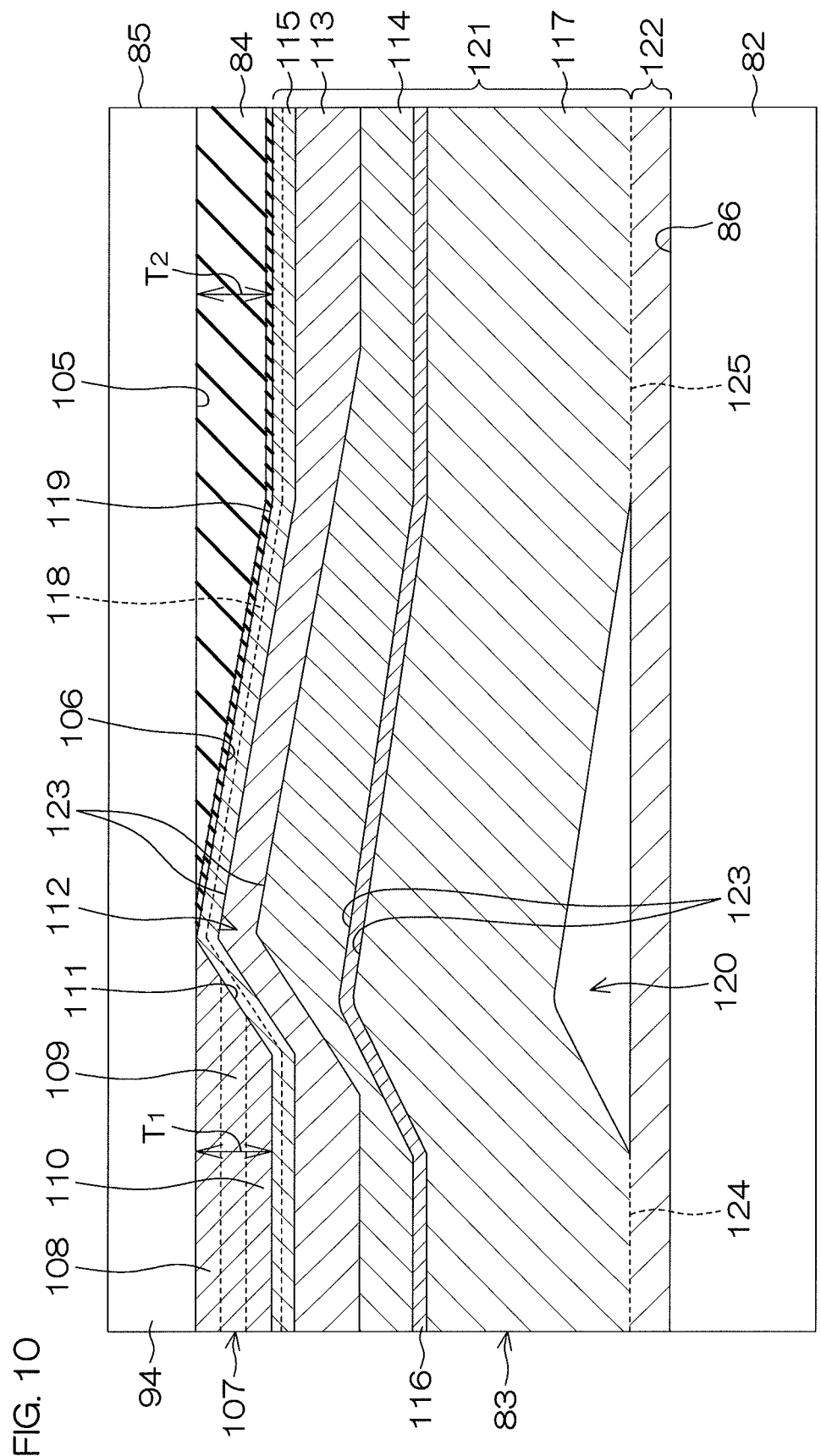
FIG. 10 is an enlarged view of a principal portion of the semiconductor light-emitting device of FIG. 9.

FIG. 10 is an enlarged view of a principal portion of the semiconductor light-emitting device 81 of FIG. 9.

In regard to a lamination configuration of the compound semiconductor layer 85, the light transmitting layer 84, and the light reflecting layer 83, first, the light transmitting layer 84 is formed on a surface of the p type contact layer 94 (second front surface 105 of the compound semiconductor layer 85).

Contact holes 106, selectively exposing the p type contact layer 94, are formed in the light transmitting layer 84. As shown in FIG. 10, each contact hole 106 may be formed to a tapered shape, with which a diameter of the contact hole 106 narrows toward the p type contact layer 94.

Inside each contact hole 106, the anode side contact layer 107 is disposed such as to contact the second front surface 105 of the p type contact layer 94. ODR (omni-directional-reflector) structures are thereby formed in the semiconductor light-emitting device 81.

A thickness $T_1$ of each anode side contact layer 107 is preferably not more than a thickness $T_2$ of the light transmitting layer 84. For example, the thickness $T_1$ may be 1500 Å to 4500 Å and the thickness $T_2$ may be 2000 Å to 5000 Å.

Each anode side contact layer 107 may have a structure, in which a first layer 108, a second layer 109, and a third layer 110 are laminated successively from the compound semiconductor layer 85 side.

The first layer 108 may contain, for example, an AuBe (gold-beryllium) alloy. The second layer 109 may contain, for example, Ni (nickel). The third layer 110 may contain, for example, Au (gold). Obviously, the first layer 108, the second layer 109, and the third layer 110 are not restricted to these materials and mutually different materials can be adopted as appropriate.

Also, the first layer 108 has, for example, a thickness of 1000 Å to 3000 Å and preferably 1000 Å to 2500 Å. The second layer 109 has, for example, a thickness of 50 Å to 200 Å and preferably 50 Å to 100 Å. The third layer 110 has, for example, a thickness of 300 Å to 2500 Å and preferably 500 Å to 2000 Å.

Each anode side contact layer 107 is formed to be smaller than an opening size (size of an opening end at an opposite side to the compound semiconductor layer 85 side) of a contact hole 106, and a space 112 is formed between a peripheral edge of the contact hole 106 and an end edge 111 of the anode side contact layer 107.

The light reflecting layer 83 is formed such as to cover the anode side contact layers 107 and the light transmitting layer 84.

The light reflecting layer 83 includes a bonding material layer 113, a first light reflecting layer 114 and a second light reflecting layer 115, facing each other across the bonding material layer 113, a barrier layer 116, laminated on the first light reflecting layer 114, and a third light reflecting layer 117, laminated on the barrier layer 116. By another expression, the light reflecting layer 83 may include the third light reflecting layer 117, the barrier layer 116, the first light reflecting layer 114, the bonding material layer 113, and the second light reflecting layer 115 that are laminated successively from the substrate 82 side.

The first light reflecting layer 114 and the second light reflecting layer 115 are layers having a light reflecting property and may each be constituted, for example, of a conductive light reflecting layer that contains Au.

The bonding material layer 113 has an element having a property of being high in adhesion force with respect to the light transmitting layer 84 (hereinafter referred to simply as "element of high adhesion force") more so than the element (that is, Au) constituting the first light reflecting layer 114 and the second light reflecting layer 115. The bonding material layer 113 is formed as an element supply source that supplies, by diffusion, the element of high adhesion force to the second light reflecting layer 115.

A bonding material diffusion region 118 is formed in a surface layer portion of the second light reflecting layer 115 in a boundary portion between the light transmitting layer 84 plus the anode side contact layers 107 and the second light reflecting layer 115. In FIG. 10, the bonding material diffusion region 118 is indicated by broken line drawn inside the second light reflecting layer 115.

The bonding material diffusion region 118 has an element constituted of the same element species as the element contained in the bonding material layer 113 and being high in adhesion force with respect to the light transmitting layer 84. The element of high adhesion force diffuses from the bonding material layer 113 to the surface layer portion of the second light reflecting layer 115. Therefore, actually, the element of high adhesion force is diffused across substantially an entirety of the second light reflecting layer 115.

A content percentage of the element of high adhesion force inside the second light reflecting layer 115 increases as the bonding material layer 113 is approached. The content percentage of the element of high adhesion force is, more specifically, a proportion of a content of the element of high adhesion force with respect to the second light reflecting layer 115.

The bonding material diffusion region 118 is thus formed across substantially the entirety inside the second light reflecting layer 115. Also, the bonding material diffusion region 118 has a concentration gradient where the content percentage of the element of high adhesion force at the light transmitting layer 84 side is lower than the content percentage of the element of high adhesion force at the bonding material layer 113 side. In the bonding material diffusion region 118, the content percentage of the element of high adhesion force at a portion contacting the light transmitting layer 84 may be more than 0% and not more than 5%.

The bonding material layer 113 may contain an AuBe (gold-beryllium) alloy. The Be of the AuBe alloy diffuses into the second light reflecting layer 115 as the element of high adhesion force with respect to the light transmitting layer 84. The bonding material diffusion region 118 may thus contain Be as the element of high adhesion force.

A mass ratio of Au in the bonding material layer 113 may be not less than 95% and not more than 99% (for example, approximately 98%). A mass ratio of Be in the bonding material layer 113 may be not less than 1% and not more than 5% (for example, approximately 2%).

An adhesion layer 119 may be formed between the second light reflecting layer 115 and the light transmitting layer 84 by the bonding material diffusion region 118, containing Be, being formed. In the present preferred embodiment, the adhesion layer 119 may include a BeO (beryllium oxide) layer. Adhesion of the second light reflecting layer 115 and the light transmitting layer 84 is improved by the forming of the adhesion layer 119.

The barrier layer 116 is a layer for preventing diffusion of the Be in the bonding material layer 113 to the third light reflecting layer 117 side. The barrier layer 116 may contain, for example, Ti (titanium).

The third light reflecting layer 117 is a layer having a light reflecting property and may be constituted, for example, of a conductive light reflecting layer that contains Au. Also, the third light reflecting layer 117 has spaces 120 at portions facing the spaces 112, each between the peripheral edge of a contact hole 106 and the end edge 111 of an anode side contact layer 107.

Across each space 120, the layer at the compound semiconductor layer 85 side is the first layer 121 (to be described below) and the layer at the opposite side is the second layer 122 (to be described below). That is, the first layer 121 includes the second light reflecting layer 115, the bonding material layer 113, the first light reflecting layer 114, the barrier layer 116, and (a portion of) the third light reflecting layer 117 that are laminated successively from the compound semiconductor layer 85 side. On the other hand, the second layer 122 includes (a portion of) the third light reflecting layer 117 formed on the substrate 82.

Also, the third light reflecting layer 117 has, in a lateral direction along the first rear surface 86 of the substrate 82, first interfaces 124 and second interfaces 125 of the first layer 121 and the second layer 122 that are mutually adjacent across the spaces 120. The first interfaces 124 are interfaces facing the anode side contact layers 107 and the second interfaces 125 are interfaces facing regions of the light transmitting layer 84 outside the contact holes 106. Among the first interfaces 124 and the second interfaces 125, the first interfaces 124 need not be formed if the thickness $T_1$ of the anode side contact layers 107 is less than the thickness $T_2$ of the light transmitting layer 84 ($T_1<T_2$). That is, gaps may be formed between the first layer 121 and the second layer 122 at positions of the first interfaces 124.

Also, with the laminated structure of the light reflecting layer 83 described above, the respective layers are laminated such as to project into the spaces 112 and are thus laminated with lamination interfaces 123 projecting at positions of the spaces 112. Thereby, when a stress is applied in the lateral direction along the first rear surface 86 of the substrate 82, the projecting lamination interfaces 123 become hitched onto each other and layer peeling can thus be suppressed.

In regard to thicknesses of the respective layers of the light reflecting layer 83, the third light reflecting layer 117 has, for example, a thickness of 10000 Å to 30000 Å and preferably 12000 Å to 20000 Å. The barrier layer 116 has, for example, a thickness of 100 Å to 1000 Å and preferably 300 Å to 800 Å. The first light reflecting layer 114 has, for example, a thickness of 1000 Å to 6000 Å and preferably 3000 Å to 5000 Å. The bonding material layer 113 has, for example, a thickness of 1000 Å to 4000 Å and preferably 2000 Å to 3000 Å. The second light reflecting layer 115 has, for example, a thickness of 100 Å to 1000 Å and preferably 500 Å to 1000 Å.

FIG. 11A to FIG. 11I are diagrams showing, in the order of process, a manufacturing process of the semiconductor light-emitting device 81 of FIG. 8 to FIG. 10.

Figure 11A:
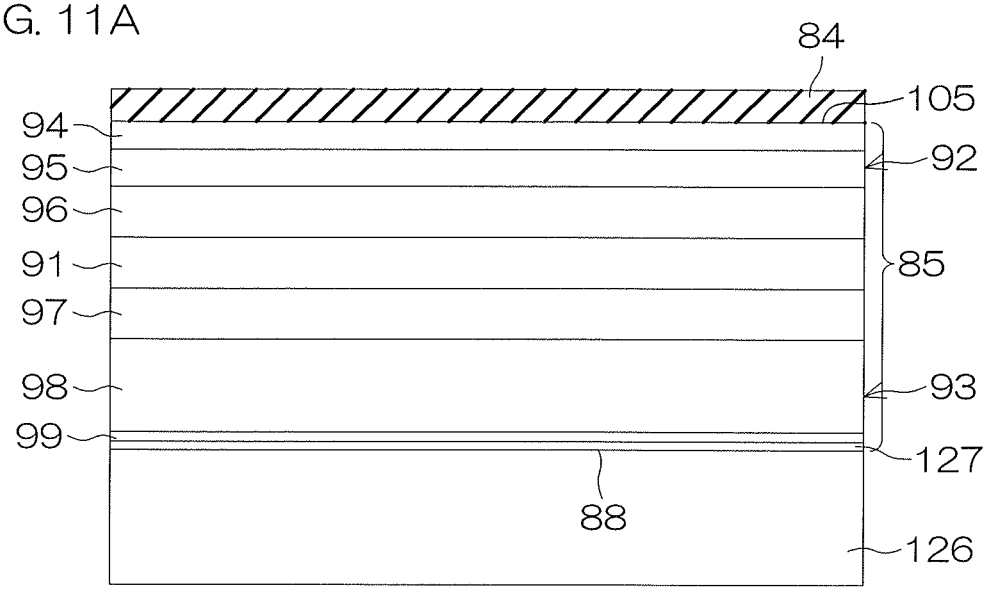
FIG. 11A is a sectional view for describing a method for manufacturing the semiconductor light-emitting device shown in FIG. 9.

To manufacture the semiconductor light-emitting device 81, for example as shown in FIG. 11A, the compound semiconductor layer 85 and the light transmitting layer 84 are formed by epitaxial growth on the growth substrate 126, constituted of GaAs, etc. As a method for growing the compound semiconductor layer 85, for example, a known growth method, such as a molecular beam epitaxial growth method, an organic metal vapor phase growth method, etc., can be applied. At the present stage, the compound semiconductor layer 85 includes, successively from the growth substrate 126 side, an n type etching stop layer 127, the n type contact layer 99, the n type window layer 98, the n type cladding layer 97, the light-emitting layer 91, the p type cladding layer 96, the p type window layer 95, and the p type contact layer 94.

Figure 11B:
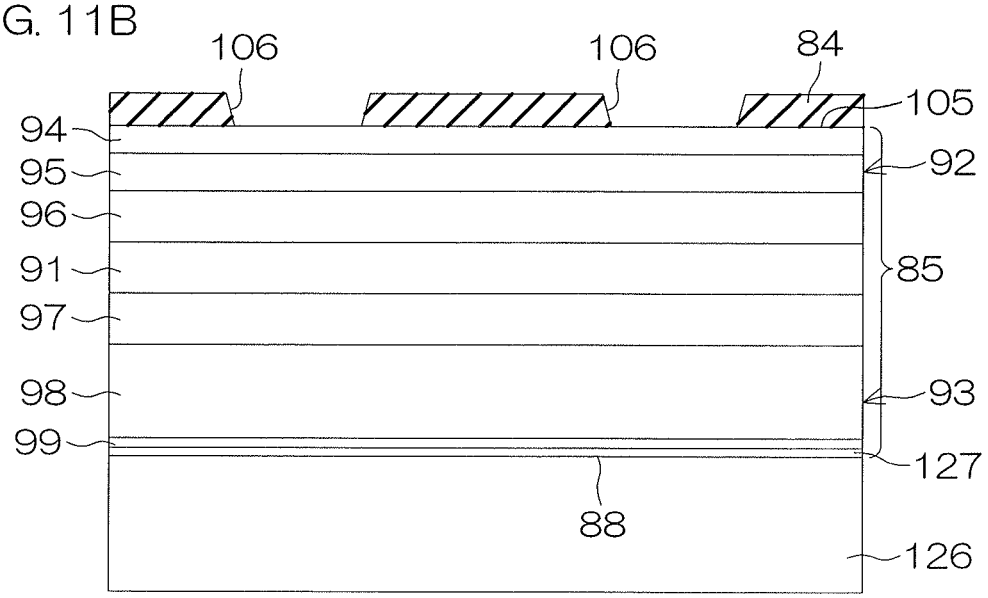
FIG. 11B is a sectional view of a step described subsequently to FIG. 11A.

Next, as shown in FIG. 11B, the contact holes 106 are formed by selectively etching the light transmitting layer 84.

Next, as shown in FIG. 11C, the anode side contact layers 107 are formed by a metal material being selectively formed inside the contact holes 106, for example, by a vapor deposition method. Here, the materials of the first layers 108, the second layers 109, and third layers 110 are laminated successively.

Next, as shown in FIG. 11D, the first layer 121 is formed on the light transmitting layer 84, for example, by a vapor deposition method. Here, the materials of the second light reflecting layer 115, the bonding material layer 113, the first light reflecting layer 114, the barrier layer 116, and (a portion of) the third light reflecting layer 117, shown in FIG. 10, are laminated successively.

The next step is a step of bonding together the growth substrate 126 and the substrate 82. In the bonding step, the first layer 121 on the growth substrate 126 and the second layer 122 on the substrate 82 are bonded. The second layer 122 is constituted of Au or an alloy containing Au and at least an outermost surface is constituted of an Au layer. The second layer 122 is formed, before the bonding, on the first front surface 90 of the substrate 82, for example, by a vapor deposition method.

More specifically, as shown in FIG. 11E, the growth substrate 126 and the substrate 82 are overlapped in a state where the first layer 121 and the second layer 122 face each other and the first layer 121 and the second layer 122 are bonded. The bonding of the first layer 121 and the second layer 122 may be performed, for example, by thermocompression bonding. The conditions of the thermocompression bonding may, for example, be a temperature of 250° C. to 700° C. and preferably approximately 300° C. to 400° C., and a pressure of 35 kN to 45 kN. By the bonding, the first layer 121 and the second layer 122 are joined together to form the light reflecting layer 83 as shown in FIG. 11F.

Next, as shown in FIG. 11F, the growth substrate 126 is removed, for example, by wet etching. Here, due to the n type etching stop layer 127 being formed on an outermost surface of the compound semiconductor layer 85, the n type contact layer 99, the n type window layer 98, etc., which contribute to characteristics of the semiconductor light-emitting device 81, need not be affected during the wet etching. Thereafter, the n type etching stop layer 127 is also removed.

The next step is a step of forming the cathode electrode layer 89. In the present preferred embodiment, the cathode electrode layer 89 is formed by a lift-off method. More specifically, first, as shown in FIG. 11G, a resist 128, having openings of the same pattern as an electrode pattern of the cathode electrode layer 89, is formed on the n type contact layer 99. Next, an electrode material 129 is laminated on the compound semiconductor layer 85, for example, by a vapor deposition method.

Figure 11H:
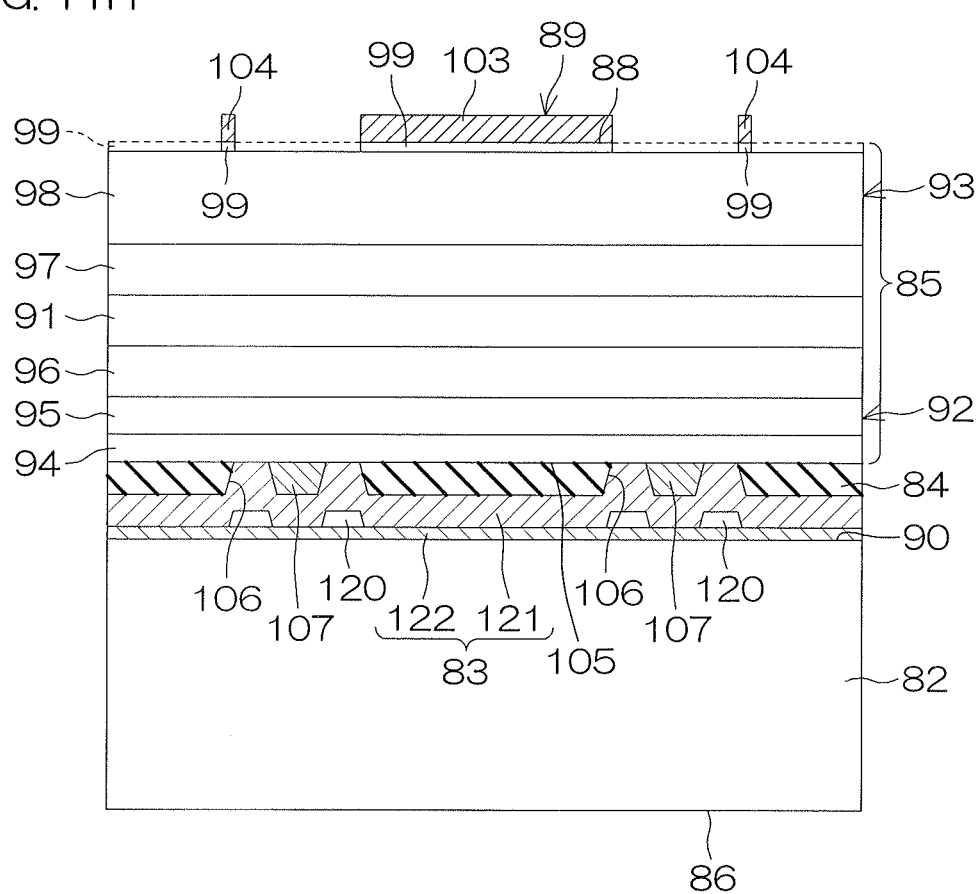
FIG. 11H is a sectional view of a step described subsequently to FIG. 11G.

Next, as shown in FIG. 11H, the electrode material 129 on the resist 128 is removed together with the resist 128. The cathode electrode layer 89, constituted of the electrode material 129 remaining on the n type contact layer 99, is thereby formed. Thereafter, the n type contact layer 99, exposed from the cathode electrode layer 89, is removed by etching. The n type window layer 98 is thereby exposed at portions besides the cathode electrode layer 89.

Next, as shown in FIG. 11I, the fine uneven shapes 102 are formed on a surface of the n type window layer 98, for example, by a frost processing (wet etching), etc. The frost processing may be performed by dry etching instead. Next, the mesa portion 100 and the lead-out portion 101 are formed by selectively removing a peripheral edge portion of the compound semiconductor layer 85. The forming of the mesa portion 100 and the lead-out portion 101 may, for example, be performed by wet etching.

Next, the anode electrode layer 87 is formed on the first rear surface 86 of the substrate 82, for example, by a vapor deposition method. The semiconductor light-emitting device 81 is obtained through the above steps.

As described above, with the semiconductor light-emitting device 81, the bonding material diffusion region 118 is formed in the surface layer portion of the second light reflecting layer 115 in the boundary portion between the light transmitting layer 84 and the second light reflecting layer 115 as shown in FIG. 10. The adhesion layer 119, constituted, for example, of a BeO (beryllium oxide) layer, is thereby formed. Consequently, an adhesion force of the second light reflecting layer 115 with respect to the light transmitting layer 84 can be improved. This result can be verified by Table 1 shown below.

Table 1 shows results indicating whether or not layer peeling occurred in the light reflecting layer 83 when a bonding wire is bonded to the pad electrode portion 103 of FIG. 8 by application of ultrasonic waves and a load (number of samples for each condition: 24). In Table 1, "Center" indicates a case where a bonding wire is bonded to a center of the pad electrode portion 103, and "20 μm" and "40 μm" respectively indicate cases where bonding wires are bonded to positions shifted by 20 μm and by 40 μm from the center of the pad electrode portion 103.

TABLE 1

| | | Second light reflecting layer thickness: 100 Å WB shifting amount | | | Second light reflecting layer thickness: 500 Å WB shifting amount | | | Second light reflecting layer thickness: 1000 Å WB shifting amount | | |
|---|---|---|---|---|---|---|---|---|---|---|
| | | Center | 20 μm | 40 μm | Center | 20 μm | 40 μm | Center | 20 μm | 40 μm |
| Ultrasonic waves/load (g weight) | 30/30 | 0/24 | 0/24 | 0/24 | 0/24 | 0/24 | 0/24 | 0/24 | 0/24 | 0/24 |
| | 35/35 | 0/24 | 0/24 | 0/24 | 0/24 | 0/24 | 0/24 | 0/24 | 0/24 | 0/24 |
| | 40/40 | 0/24 | 0/24 | 0/24 | 0/24 | 0/24 | 0/24 | 0/24 | 0/24 | 0/24 |

As is clear from Table 1, layer peeling in the light reflecting layer 83 did not occur under any of the conditions.

Further, with the semiconductor light-emitting device 81, by the bonding material layer 113, containing Be, not being directly laminated on the light transmitting layer 84 and the second light reflecting layer 115 being interposed instead, the light reflecting layer 83 can be improved in reflectance and the semiconductor light-emitting device 81 can be improved in luminous intensity. This result is shown in FIG. 12.

Figure 12:
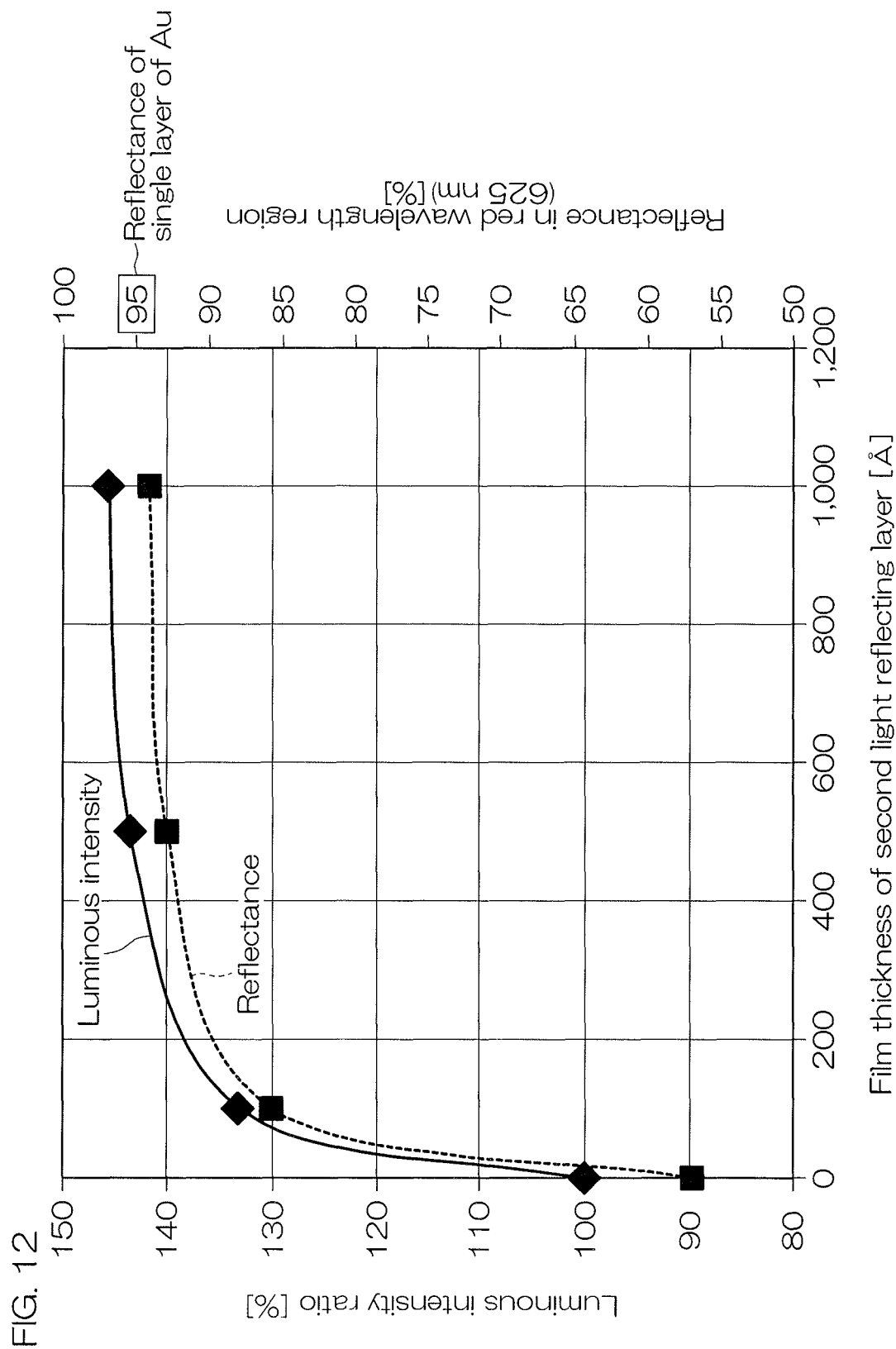
FIG. 12 is a graph showing relationships of a second light reflecting layer and each of luminous intensity and reflectance.

FIG. 12 is a graph showing relationships of the second light reflecting layer 115 and each of luminous intensity and reflectance. In FIG. 12, a case where the thickness of the second light reflecting layer 115=0 Å indicates a case where the bonding material layer 113 is in direct contact with the light transmitting layer 84.

From FIG. 12, it can be understood that by the second light reflecting layer 115 being interposed between the light transmitting layer 84 and the bonding material layer 113 (by the thickness of the second light reflecting layer 115>0 Å), both the reflectance of the light reflecting layer 83 and the luminous intensity of the semiconductor light-emitting device 81 are improved. In particular, if the thickness of the second light reflecting layer 115 is in a range of 100 Å to 1000 Å, sufficient reflectance and luminous intensity can be obtained, and if the thickness is in a range of 500 Å to 1000 Å, a reflectance approximately equal to a reflectance of a single Au layer (=95%) can be expressed even under the presence of the bonding material diffusion region 118. However, it is added that when the bonding material layer 113 is not provided and the second light reflecting layer 115 is made a single Au layer, adhesion of the light transmitting layer 84 and the second light reflecting layer 115 is poor in comparison to the structure of the semiconductor light-emitting device 81.

Also, diffusion of the Be in the bonding material layer 113 to the third light reflecting layer 117 side can be prevented because the barrier layer 116 is interposed between the first light reflecting layer 114 and the third light reflecting layer 117. Forming of an oxide, such as a BeO layer, etc., on a surface of the first layer 121 prior to the thermocompression of the first layer 121 and the second layer 122 (FIG. 11E) and decrease of adhesion of the first layer 121 and the second layer 122 during the thermocompression can thereby be suppressed. Here, the forming of the barrier layer 116 is effective because Be spreads more readily across an entire Au layer in comparison to Cr.

Further, by the thickness $T_1$ of the anode side contact layers 107 being not more than the thickness $T_2$ of the light transmitting layer 84, the first interfaces 124 of FIG. 10 can be prevented from projecting further to the side opposite to the compound semiconductor layer 85 in comparison to the second interfaces 125. That is, in regard to heights based on the second front surface 105 of the compound semiconductor layer 85, by making a height of the second interfaces 125 on the light transmitting layer 84, which has a greater occupancy ratio than the ODR structures (anode side contact layers 107) of FIG. 8, higher than a height of the first interfaces 124, the first layer 121 and the second layer 122 of the light reflecting layer 83 can be adhered over a wider area.

Although preferred embodiments of the present invention have been described above, the present invention may also be implemented in yet other configurations.

With the method for manufacturing the semiconductor light-emitting device 1 described above, an example where the bonding material layer 4 is formed on the second light reflecting layer 23 was described (see FIG. 4H). The bonding material layer 4 may instead be formed on the first light reflecting layer 12 of the non-light-emitting body portion 2 after the step of the first light reflecting layer 12 (see FIG. 4C).

With the method for manufacturing the semiconductor light-emitting device 61 described above, an example where the bonding material layer 65 is formed on the second light reflecting layer 23 was described (see FIG. 6E). The bonding material layer 65 may instead be formed on the first light reflecting layer 12 of the non-light-emitting body portion 2 after the step of the first light reflecting layer 12 (see FIG. 4C).

Although the alphanumeric characters in parentheses in the following description express corresponding components, etc., in the respective preferred embodiments described above, these are indicated exemplarily to merely clarify technical ideas and/or conceptions and are not inserted with the intent of restriction to the components inside the parentheses.

The technical idea and/or conception of the first preferred embodiment described above can also be applied to various fields other than the field of semiconductor light-emitting devices. That is, the technical idea and/or conception of forming a bonding material diffusion region (41), which contains an element (Cr) having a property of being high in adhesion force with respect to a light transmitting layer (ITO layer), at a surface layer portion of a light reflecting layer (Au layer) to increase an adhesion force of the light reflecting layer (Au layer) with respect to the light transmitting layer (ITO layer) can be applied to various fields.

For example, a bonded structure, including a light transmitting layer (22), a light reflecting layer (23), covering the light transmitting layer, and a bonding material diffusion region (41), formed in a surface layer portion of the light reflecting layer in a boundary portion between the light transmitting layer and the light reflecting layer and having an element (Cr) having a property of being high in adhesion force with respect to the light transmitting layer more so than an element (Au) constituting the light reflecting layer, may be provided.

The present bonded structure can be applied to various applications belonging to electric and electronic fields besides semiconductor light-emitting devices. The various applications may include electronic parts, semiconductor laser devices, semiconductor devices, etc.

The present bonded structure may further include a bonding material layer (4), covering the light reflecting layer such as to face the light transmitting layer across the light reflecting layer and having an element (Cr) having a property of being high in adhesion force with respect to the light transmitting layer more so than the element (Au) constituting the light reflecting layer.

The present bonded structure may further include a second light reflecting layer (12), covering the bonding material layer such as to face the light reflecting layer across the bonding material layer. The second light reflecting layer may have an element (Au) constituted of the same element species as the element (Au) constituting the light reflecting layer.

The technical idea and/or conception of the second preferred embodiment described above can also be applied to various fields other than the field of semiconductor light-emitting devices. That is, the technical idea and/or conception of forming a bonding material diffusion region (66), which contains an element (Be) having a property of being high in adhesion force with respect to a light transmitting layer ($SiO_2$ layer and/or SiN layer), at a surface layer portion of a light reflecting layer (Au layer) to increase an adhesion force of the light reflecting layer (Au layer) with respect to the light transmitting layer ($SiO_2$ layer and/or SiN layer) can be applied to various fields.

For example, a bonded structure, including a light transmitting layer (62), a light reflecting layer (23), covering the light transmitting layer, and a bonding material diffusion region (66), formed in a surface layer portion of the light reflecting layer in a boundary portion between the light transmitting layer and the light reflecting layer and having an element (Be) having a property of being high in adhesion force with respect to the light transmitting layer more so than an element (Au) constituting the light reflecting layer, may be provided.

The present bonded structure can be applied to various applications belonging to electric and electronic fields besides semiconductor light-emitting devices. The various applications may include electronic parts, semiconductor laser devices, semiconductor devices, etc.

The present bonded structure may further include a bonding material layer (65), covering the light reflecting layer such as to face the light transmitting layer across the light reflecting layer and having an element (Be) having a property of being high in adhesion force with respect to the light transmitting layer more so than the element (Au) constituting the light reflecting layer.

The present bonded structure may further include a second light reflecting layer (12), covering the bonding material layer such as to face the light reflecting layer across the bonding material layer. The second light reflecting layer may have an element (Au) constituted of the same element species as the element (Au) constituting the light reflecting layer.

Besides the above, various design changes may be applied within the scope of the matters described in the claims.

What is claimed is:

1. A semiconductor light-emitting device comprising:
a semiconductor layer, having a major surface and generating light;
a light transmitting layer, having a light transmitting property and covering the major surface of the semiconductor layer;
a light reflecting layer, having a light reflecting property and covering the light transmitting layer; and
a bonding material diffusion region, formed in a surface layer portion of the light reflecting layer in a boundary portion between the light transmitting layer and the light reflecting layer and having an element having a property of being high in adhesion force with respect to the light transmitting layer more so than an element constituting the light reflecting layer, wherein
the light transmitting layer has a bonding surface bonded to the light reflecting layer,
the bonding material diffusion region is formed in the surface layer portion of the light reflecting layer in the boundary portion between the light transmitting layer and the light reflecting layer such that the bonding material diffusion region is in contact with a whole area of the bonding surface of the light transmitting layer.

2. The semiconductor light-emitting device according to claim 1, further comprising: a bonding material layer, covering the light reflecting layer such that the bonding material layer faces the light transmitting layer across the light reflecting layer and having an element having a property of being high in adhesion force with respect to the light transmitting layer more so than the element constituting the light reflecting layer.

3. The semiconductor light-emitting device according to claim 2, wherein the bonding material diffusion region contains an element constituted of the same element species as the element contained in the bonding material layer.

4. The semiconductor light-emitting device according to claim 2, wherein the bonding material layer is formed as an element supply source that supplies, by diffusion, the element having the property of being high in adhesion force with respect to the light transmitting layer to the surface layer portion of the light reflecting layer, and
the bonding material diffusion region contains the element diffused from the bonding material layer to the surface layer portion of the light reflecting layer.

5. The semiconductor light-emitting device according to claim 1, wherein the light reflecting layer contains gold.

6. The semiconductor light-emitting device according to claim 1, wherein the light transmitting layer contains indium tin oxide, and
the bonding material diffusion region contains chromium as the element having the property of being high in adhesion force with respect to the light transmitting layer.

7. The semiconductor light-emitting device according to claim 1, wherein the light transmitting layer contains one of either or both of silicon oxide and silicon nitride, and
the bonding material diffusion region contains beryllium as the element having the property of being high in adhesion force with respect to the light transmitting layer.

8. A semiconductor light-emitting device comprising:
a non-light-emitting body portion, including a substrate, having a first front surface at one side and a first rear surface at another side, and a first light reflecting layer, having a light reflecting property and covering the first front surface of the substrate; and
a light-emitting body portion, including a semiconductor layer, having a second front surface at one side and a second rear surface at another side and generating light, a light transmitting layer, having a light transmitting property and covering the second front surface of the semiconductor layer, a second light reflecting layer, having a light reflecting property and covering the light transmitting layer, and a bonding material diffusion region, formed in a surface layer portion of the second light reflecting layer in a boundary portion between the light transmitting layer and the second light reflecting layer and having an element having a property of being high in adhesion force with respect to the light transmitting layer more so than an element constituting the second light reflecting layer, and being disposed on the non-light-emitting body portion in an orientation where the second front surface of the semiconductor layer faces the first front surface of the substrate of the non-light-emitting body portion, wherein
the light transmitting layer has a bonding surface bonded to the second light reflecting layer,
the bonding material diffusion region is formed in the surface layer portion of the second light reflecting layer in the boundary portion between the light transmitting layer and the second light reflecting layer such that the bonding material diffusion region is in contact with a whole area of the bonding surface of the light transmitting layer.

9. The semiconductor light-emitting device according to claim 8, further comprising: a bonding material layer, interposed between the first light reflecting layer of the non-light-emitting body portion and the second light reflecting layer of the light-emitting body portion and containing an element having a property of being high in adhesion force with respect to the light transmitting layer more so than the element constituting the second light reflecting layer.

10. The semiconductor light-emitting device according to claim 9, wherein the bonding material diffusion region contains an element constituted of the same element species as the element contained in the bonding material layer.

11. The semiconductor light-emitting device according to claim 9, wherein the bonding material layer is formed as an element supply source that supplies, by diffusion, the element having the property of being high in adhesion force with respect to the light transmitting layer to the surface layer portion of the second light reflecting layer, and
the bonding material diffusion region contains the element diffused from the bonding material layer to the surface layer portion of the second light reflecting layer.

12. The semiconductor light-emitting device according to claim 8, wherein the second light reflecting layer contains gold.

13. The semiconductor light-emitting device according to claim 8, wherein the light transmitting layer contains indium tin oxide, and
the bonding material diffusion region contains chromium as an element having a property of being high in adhesion force with respect to the indium tin oxide.

14. The semiconductor light-emitting device according to claim 8, wherein the light transmitting layer contains one of either or both of silicon oxide and silicon nitride, and the bonding material diffusion region contains beryllium as an element having a property of being high in adhesion force with respect to the silicon oxide.

15. The semiconductor light-emitting device according to claim 13, wherein the second light reflecting layer contains gold.

16. The semiconductor light-emitting device according to claim 8, wherein the substrate includes a conductor substrate or a semiconductor substrate.

17. The semiconductor light-emitting device according to claim 8, further comprising:
a first electrode, covering the first rear surface of the substrate; and
a second electrode, covering the second rear surface of the semiconductor layer.

18. The semiconductor light-emitting device according to claim 2, further comprising a contact electrode formed inside a contact hole penetrating the light transmitting layer, wherein
the bonding material diffusion region is formed between the contact electrode and the bonding material layer such that the bonding material diffusion region is in contact with the bonding surface of the light transmitting layer and the contact electrode.

19. The semiconductor light-emitting device according to claim 18, further comprising an electrode partially formed on a second major surface opposite to the major surface of the semiconductor layer, wherein
the contact electrode is not overlapped with the electrode in a plan view.

20. The semiconductor light-emitting device according to claim 2, wherein
a ratio of a thickness of the bonding material layer with respect to a thickness of the light reflecting layer is not less than 0.5 and not more than 5.0.

21. The semiconductor light-emitting device according to claim 2, wherein the thickness of the bonding material layer is not less than 0.05 μm and not more than 0.25 μm.

22. The semiconductor light-emitting device according to claim 2, wherein the bonding material diffusion region has a concentration gradient where a content percentage of the element of high adhesion force at the light transmitting layer side is lower than a content percentage of the element of high adhesion force at the bonding material layer side.

23. The semiconductor light-emitting device according to claim 1, wherein the bonding material diffusion region has no boundary surface with the light transmitting layer extending in a thickness direction of the light transmitting layer.

24. The semiconductor light-emitting device according to claim 9, further comprising a contact electrode formed inside a contact hole penetrating the light transmitting layer, wherein
the bonding material diffusion region is formed between the contact electrode and the bonding material layer such that the bonding material diffusion region is in contact with the bonding surface of the light transmitting layer and the contact electrode.

25. The semiconductor light-emitting device according to claim 24, further comprising an electrode partially formed on the second rear surface of the semiconductor layer, wherein
the contact electrode is not overlapped with the electrode in a plan view.

26. The semiconductor light-emitting device according to claim 9, wherein
   a ratio of a thickness of the bonding material layer with respect to a thickness of the second light reflecting layer is not less than 0.5 and not more than 5.0.

27. The semiconductor light-emitting device according to claim 9, wherein the thickness of the bonding material layer is not less than 0.05 µm and not more than 0.25 µm.

28. The semiconductor light-emitting device according to claim 9, wherein the bonding material diffusion region has a concentration gradient where a content percentage of the element of high adhesion force at the light transmitting layer side is lower than a content percentage of the element of high adhesion force at the bonding material layer side.

29. The semiconductor light-emitting device according to claim 8, wherein the bonding material diffusion region has no boundary surface with the light transmitting layer extending in a thickness direction of the light transmitting layer.

\* \* \* \* \*